(12) United States Patent
Currie et al.

(10) Patent No.: US 7,638,842 B2
(45) Date of Patent: Dec. 29, 2009

(54) LATTICE-MISMATCHED SEMICONDUCTOR STRUCTURES ON INSULATORS

(75) Inventors: Matthew T. Currie, Brookline, MA (US); Anthony J. Lochtefeld, Somerville, MA (US); Zhiyuan Cheng, Lincoln, MA (US); Thomas A. Langdo, Framingham, MA (US)

(73) Assignee: AmberWave Systems Corporation, Salem, NH (US)

( * ) Notice: Subject to any disclaimer, the term of this patent is extended or adjusted under 35 U.S.C. 154(b) by 0 days.

(21) Appl. No.: 11/220,482

(22) Filed: Sep. 7, 2005

(65) Prior Publication Data

US 2007/0054465 A1 Mar. 8, 2007

(51) Int. Cl.
*H01L 23/62* (2006.01)

(52) U.S. Cl. .............................. 257/347; 257/E27.112

(58) Field of Classification Search ................. 257/347, 257/E29.081, E29.085, E29.097, E29.091
See application file for complete search history.

(56) References Cited

U.S. PATENT DOCUMENTS

| | | | |
|---|---|---|---|
| 4,545,109 A | 10/1985 | Reichert | |
| 4,551,394 A | 11/1985 | Betsch et al. | |
| 4,651,179 A | 3/1987 | Reichert | |
| 4,727,047 A | 2/1988 | Bozler et al. | |
| 4,774,205 A | 9/1988 | Choi et al. | |
| 4,789,643 A | 12/1988 | Kajikawa | |
| 4,826,784 A | 5/1989 | Salerno et al. | |
| 4,860,081 A * | 8/1989 | Cogan | 257/501 |
| 4,948,456 A | 8/1990 | Schubert | |
| 5,032,893 A | 7/1991 | Fitzgerald et al. | |
| 5,034,337 A | 7/1991 | Mosher et al. | |
| 5,061,644 A | 10/1991 | Yue et al. | |
| 5,091,333 A | 2/1992 | Fan et al. | |
| 5,091,767 A | 2/1992 | Bean et al. | |
| 5,093,699 A | 3/1992 | Weichold et al. | |
| 5,105,247 A | 4/1992 | Cavanaugh | |
| 5,156,995 A | 10/1992 | Fitzgerald, Jr. et al. | |
| 5,166,767 A | 11/1992 | Kapoor et al. | |
| 5,236,546 A | 8/1993 | Mizutani | |
| 5,238,869 A | 8/1993 | Shichijo et al. | |

(Continued)

FOREIGN PATENT DOCUMENTS

DE 103 20 160 A1 8/2004

(Continued)

OTHER PUBLICATIONS

Asano, T.; Tojyo, T.; Yanashima, K.; Takeya, M.; Hino, T.; Ikeda, S.; Kijima, S.; Ansai, S.; Shibuya, K.; Goto, S.; Tomiya, S.; Yabuki, Y.; Aoki, T.; Uchida, S.; Ikeda, M., "AlGaInN laser diodes grown on an ELO-GaN substrate vs. on a sapphire substrate," *Semiconductor Laser Conference, 2000. Conference Digest. 2000 IEEE 17th International*, vol., No. pp. 109-110, 2000.

(Continued)

*Primary Examiner*—Kenneth A Parker
*Assistant Examiner*—Anthony Ho

(57) ABSTRACT

Monolithic lattice-mismatched semiconductor heterostructures are fabricated by bonding patterned substrates with alternative active-area materials formed thereon to a rigid dielectric platform and then removing the highly-defective interface areas along with the underlying substrates to produce alternative active-area regions disposed over the insulator and substantially exhausted of misfit and threading dislocations.

41 Claims, 10 Drawing Sheets

U.S. PATENT DOCUMENTS

| | | | |
|---|---|---|---|
| 5,256,594 A | 10/1993 | Wu et al. | |
| 5,269,876 A | 12/1993 | Mizutani | |
| 5,281,283 A | 1/1994 | Tokunaga et al. | |
| 5,285,086 A | 2/1994 | Fitzgerald, Jr. | |
| 5,295,150 A | 3/1994 | Vangieson et al. | |
| 5,403,751 A | 4/1995 | Nishida et al. | |
| 5,417,180 A | 5/1995 | Nakamura et al. | |
| 5,427,976 A | 6/1995 | Koh et al. | |
| 5,432,120 A | 7/1995 | Meister et al. | |
| 5,438,018 A | 8/1995 | Mori et al. | |
| 5,518,953 A | 5/1996 | Takasu | |
| 5,589,696 A | 12/1996 | Baba et al. | |
| 5,621,227 A | 4/1997 | Joshi | |
| 5,640,022 A | 6/1997 | Inai et al. | |
| 5,710,436 A | 1/1998 | Tanamoto et al. | |
| 5,717,709 A | 2/1998 | Sasaki et al. | |
| 5,792,679 A | 8/1998 | Nakato | |
| 5,825,049 A | 10/1998 | Simmons et al. | |
| 5,849,077 A | 12/1998 | Kenney | |
| 5,886,385 A | 3/1999 | Arisumi et al. | |
| 5,953,361 A | 9/1999 | Borchert et al. | |
| 5,966,620 A | 10/1999 | Sakaguchi et al. | |
| 6,011,271 A | 1/2000 | Sakuma et al. | |
| 6,015,979 A | 1/2000 | Sugiura et al. | |
| 6,049,098 A | 4/2000 | Sato et al. | |
| 6,100,106 A | 8/2000 | Yamaguchi et al. | |
| 6,111,288 A | 8/2000 | Watanabe et al. | |
| 6,191,432 B1 | 2/2001 | Sugiyama et al. | |
| 6,228,691 B1 * | 5/2001 | Doyle | 438/149 |
| 6,235,547 B1 | 5/2001 | Sakuma et al. | |
| 6,252,261 B1 | 6/2001 | Usui et al. | |
| 6,271,551 B1 | 8/2001 | Schmitz et al. | |
| 6,320,220 B1 | 11/2001 | Watanabe et al. | |
| 6,342,404 B1 | 1/2002 | Shibata et al. | |
| 6,348,096 B1 | 2/2002 | Sunakawa et al. | |
| 6,362,071 B1 * | 3/2002 | Nguyen et al. | 438/416 |
| 6,492,216 B1 | 12/2002 | Yeo et al. | |
| 6,512,252 B1 | 1/2003 | Takagi et al. | |
| 6,521,514 B1 | 2/2003 | Gehrke et al. | |
| 6,576,532 B1 | 6/2003 | Jones et al. | |
| 6,579,463 B1 | 6/2003 | Winningham et al. | |
| 6,603,172 B1 | 8/2003 | Segawa et al. | |
| 6,617,643 B1 | 9/2003 | Goodwin-Johansson | |
| 6,635,110 B1 * | 10/2003 | Luan et al. | 117/4 |
| 6,686,245 B1 | 2/2004 | Mathew et al. | |
| 6,710,368 B2 | 3/2004 | Fisher et al. | |
| 6,720,196 B2 * | 4/2004 | Kunisato et al. | 438/22 |
| 6,727,523 B2 | 4/2004 | Morita | |
| 6,753,555 B2 | 6/2004 | Takagi et al. | |
| 6,784,074 B2 | 8/2004 | Shchukin et al. | |
| 6,803,598 B1 | 10/2004 | Berger et al. | |
| 6,809,351 B2 | 10/2004 | Kuramoto et al. | |
| 6,812,495 B2 | 11/2004 | Wada et al. | |
| 6,815,241 B2 | 11/2004 | Wang et al. | |
| 6,825,534 B2 | 11/2004 | Chen et al. | |
| 6,835,246 B2 | 12/2004 | Zaidi | |
| 6,841,410 B2 | 1/2005 | Sasaoka | |
| 6,841,808 B2 | 1/2005 | Shibata et al. | |
| 6,855,990 B2 | 2/2005 | Yeo et al. | |
| 6,867,433 B2 | 3/2005 | Yeo et al. | |
| 6,873,009 B2 | 3/2005 | Hisamoto et al. | |
| 6,887,773 B2 | 5/2005 | Gunn, III et al. | |
| 6,900,070 B2 | 5/2005 | Craven et al. | |
| 6,902,965 B2 | 6/2005 | Ge et al. | |
| 6,917,068 B1 | 7/2005 | Krivokapic | |
| 6,919,258 B2 | 7/2005 | Grant et al. | |
| 6,920,159 B2 | 7/2005 | Sidorin et al. | |
| 6,921,673 B2 | 7/2005 | Kobayashi et al. | |
| 6,946,683 B2 | 9/2005 | Sano et al. | |
| 6,955,977 B2 | 10/2005 | Kong et al. | |
| 6,958,254 B2 | 10/2005 | Seifert | |
| 6,960,781 B2 | 11/2005 | Currie et al. | |
| 6,982,204 B2 | 1/2006 | Saxler et al. | |
| 6,984,571 B1 | 1/2006 | Enquist | |
| 6,991,998 B2 * | 1/2006 | Bedell et al. | 438/479 |
| 6,994,751 B2 | 2/2006 | Hata et al. | |
| 6,995,430 B2 | 2/2006 | Langdo et al. | |
| 6,995,456 B2 | 2/2006 | Nowak | |
| 6,998,684 B2 | 2/2006 | Anderson et al. | |
| 7,001,804 B2 | 2/2006 | Dietz et al. | |
| 7,012,298 B1 | 3/2006 | Krivokapic | |
| 7,012,314 B2 | 3/2006 | Bude et al. | |
| 7,015,497 B1 | 3/2006 | Berger | |
| 7,015,517 B2 | 3/2006 | Grant et al. | |
| 7,033,436 B2 | 4/2006 | Biwa et al. | |
| 7,033,936 B1 | 4/2006 | Green | |
| 7,041,178 B2 | 5/2006 | Tong et al. | |
| 7,049,627 B2 | 5/2006 | Vineis et al. | |
| 7,074,623 B2 | 7/2006 | Lochtefeld et al. | |
| 7,078,731 B2 | 7/2006 | D'Evelyn et al. | |
| 7,084,051 B2 | 8/2006 | Ueda et al. | |
| 7,084,441 B2 | 8/2006 | Saxler | |
| 7,087,965 B2 | 8/2006 | Chan et al. | |
| 7,095,043 B2 | 8/2006 | Oda et al. | |
| 7,098,508 B2 | 8/2006 | Ieong et al. | |
| 7,101,444 B2 | 9/2006 | Shchukin et al. | |
| 7,109,516 B2 | 9/2006 | Langdo et al. | |
| 7,119,402 B2 | 10/2006 | Kinoshita et al. | |
| 7,125,785 B2 | 10/2006 | Cohen et al. | |
| 7,128,846 B2 | 10/2006 | Nishijima et al. | |
| 7,132,691 B1 | 11/2006 | Tanabe et al. | |
| 7,138,292 B2 | 11/2006 | Mirabedini et al. | |
| 7,160,753 B2 | 1/2007 | Williams, Jr. | |
| 7,195,993 B2 | 3/2007 | Zheleva et al. | |
| 7,205,586 B2 | 4/2007 | Takagi et al. | |
| 7,211,864 B2 | 5/2007 | Seliskar | |
| 7,224,033 B2 | 5/2007 | Zhu et al. | |
| 7,244,958 B2 | 7/2007 | Shang et al. | |
| 7,247,534 B2 | 7/2007 | Chidambarrao et al. | |
| 7,247,912 B2 | 7/2007 | Zhu et al. | |
| 7,250,359 B2 | 7/2007 | Fitzgerald | |
| 7,262,117 B1 | 8/2007 | Gunn, III et al. | |
| 7,268,058 B2 | 9/2007 | Chau et al. | |
| 7,344,942 B2 | 3/2008 | Korber | |
| 2001/0006249 A1 | 7/2001 | Fitzgerald | |
| 2001/0045604 A1 | 11/2001 | Oda et al. | |
| 2002/0030246 A1 | 3/2002 | Eisenbeiser et al. | |
| 2002/0047155 A1 * | 4/2002 | Babcock et al. | 257/315 |
| 2002/0066403 A1 | 6/2002 | Sunakawa | |
| 2002/0070383 A1 | 6/2002 | Shibata et al. | |
| 2003/0045017 A1 | 3/2003 | Hiramatsu et al. | |
| 2003/0064535 A1 | 4/2003 | Kub et al. | |
| 2003/0087462 A1 | 5/2003 | Koide et al. | |
| 2003/0089899 A1 | 5/2003 | Lieber et al. | |
| 2003/0155586 A1 | 8/2003 | Koide et al. | |
| 2003/0207518 A1 | 11/2003 | Kong et al. | |
| 2004/0005740 A1 * | 1/2004 | Lochtefeld et al. | 438/149 |
| 2004/0012037 A1 | 1/2004 | Venkatesan et al. | |
| 2004/0072410 A1 | 4/2004 | Motoki et al. | |
| 2004/0075105 A1 | 4/2004 | Leitz et al. | |
| 2005/0003572 A1 | 1/2005 | Hahn et al. | |
| 2005/0045983 A1 | 3/2005 | Noda et al. | |
| 2005/0054180 A1 | 3/2005 | Han et al. | |
| 2005/0073028 A1 | 4/2005 | Grant et al. | |
| 2005/0093021 A1 | 5/2005 | Ouyang et al. | |
| 2005/0104156 A1 | 5/2005 | Wasshuber | |
| 2005/0118825 A1 | 6/2005 | Nishijima et al. | |
| 2005/0145941 A1 | 7/2005 | Bedell et al. | |
| 2005/0164475 A1 | 7/2005 | Peckerar et al. | |
| 2005/0181549 A1 | 8/2005 | Barr et al. | |
| 2005/0184302 A1 | 8/2005 | Kobayashi et al. | |
| 2005/0205859 A1 | 9/2005 | Currie et al. | |
| 2005/0205932 A1 | 9/2005 | Cohen | |
| 2005/0212051 A1 * | 9/2005 | Jozwiak et al. | 257/355 |

| | | |
|---|---|---|
| 2005/0217565 A1 | 10/2005 | Lahreche et al. |
| 2006/0009012 A1 | 1/2006 | Leitz et al. |
| 2006/0019462 A1 | 1/2006 | Cheng et al. |
| 2006/0049409 A1 | 3/2006 | Rafferty et al. |
| 2006/0105533 A1 | 5/2006 | Chong et al. |
| 2006/0113603 A1 | 6/2006 | Currie |
| 2006/0128124 A1 | 6/2006 | Haskell et al. |
| 2006/0131606 A1 | 6/2006 | Cheng |
| 2006/0145264 A1 | 7/2006 | Chidambarrao et al. |
| 2006/0160291 A1 | 7/2006 | Lee et al. |
| 2006/0175601 A1 | 8/2006 | Lieber et al. |
| 2006/0189056 A1 | 8/2006 | Ko et al. |
| 2006/0205197 A1 | 9/2006 | Yi et al. |
| 2006/0211210 A1 | 9/2006 | Bhat et al. |
| 2006/0292719 A1 | 12/2006 | Lochtefeld et al. |
| 2007/0029643 A1 | 2/2007 | Johnson et al. |
| 2007/0054497 A1 | 3/2007 | Currie et al. |
| 2007/0181977 A1 | 8/2007 | Lochtefeld et al. |
| 2007/0187668 A1 | 8/2007 | Noguchi et al. |
| 2007/0267722 A1 | 11/2007 | Lochtefeld et al. |
| 2008/0001169 A1 | 1/2008 | Lochtefeld |
| 2008/0070355 A1 | 3/2008 | Lochtefeld et al. |
| 2008/0073641 A1 | 3/2008 | Cheng et al. |
| 2008/0073667 A1 | 3/2008 | Lochtefeld |
| 2008/0093622 A1 | 4/2008 | Li et al. |
| 2008/0099785 A1 | 5/2008 | Bai et al. |
| 2008/0187018 A1 | 8/2008 | Li |
| 2009/0039361 A1 | 2/2009 | Li et al. |
| 2009/0065047 A1 | 3/2009 | Fiorenza et al. |

FOREIGN PATENT DOCUMENTS

| | | |
|---|---|---|
| EP | 1 551 063 | 7/2005 |
| EP | 1551063 | 7/2005 |
| EP | 1 796 180 | 6/2007 |
| JP | 2-62090 | 3/1990 |
| JP | 2000-286449 | 10/2000 |
| JP | 2004-200375 | 7/2004 |
| WO | WO 02/086952 | 10/2002 |
| WO | WO 2004/023536 | 3/2004 |
| WO | WO-2004/023536 | 3/2004 |
| WO | WO-2005/013375 | 2/2005 |
| WO | WO 2005/048330 | 5/2005 |
| WO | WO 2005/122267 A2 | 12/2005 |
| WO | WO 2006/025407 | 3/2006 |
| WO | WO 2006/125040 | 11/2006 |

OTHER PUBLICATIONS

Ashby, C.I.H.; Willan, C.C.; Jung Han; Missert, N.A.; Provencio, P.P.; Follstaedt, D.M.; Peake, G.M.; Griego, L. Source: "Low-dislocation-density GaN from a single growth on a textured substrate." Applied Physics Letters, v 77 n. 20, Nov. 13, 2000, p. 3233-5.

Bakkers et al., "Epitaxial Growth on InP Nanowires on Germanium," *Nature Materials* vol. 3 (Nov. 2004), pp. 769-773.

Baron et al., "Chemical Vapor Deposition of Ge Nanocrystals on $SiO_2$," *Applied Physics Letters* vol. 83, No. 7 (Aug. 18, 2003), pp. 1444-1446.

Beltz et al., "A Theoretical Model for Threading Dislocation Reduction During Selective Area Growth," *Materials Science and Engineering*, A234-236 (1997), pp. 794-797.

Borland, J.O., "Novel device structures by selective epitaxial growth (SEG)," *Electron Devices Meeting, 1987 International*, vol. 33, No. pp. 12-15, 1987.

Bryskiewicz, T., "Dislocation filtering in SiGe and InGaAs buffer layers grown by selective lateral overgrowth method," Applied Physics Letters, v 66, n 10, Mar. 6, 1995, p. 1237-9.

Bushroa, A.R.; Jacob, C.; Saijo, H.; Nishino, S. "Lateral epitaxial overgrowth and reduction in defect density of 3C-SiC on patterned Si substrates," Journal of Crystal Growth, v 271, n 1-2, Oct. 15, 2004, p. 200-6.

Cannon et al., "Monolithic Si-based Technology for Optical Receiver Circuits," *Proceedings of SPIE*, vol. 4999 (2003), pp. 145-155.

Chan et al., "Influence of metalorganic Sources on the Composition Uniformity of Selectively Grown $Ga_xIn_{1-x}P$," *Jpn J. Appl. Phys.*, vol. 33 (1994) pp. 4812-4819.

Chang, Y.S.; Naritsuka, S.; Nishinaga, T., "Effect of growth temperature on epitaxial lateral overgrowth of GaAs on Si substrate," Journal of Crystal Growth, v 174, n 1-4, Apr. 1997. p. 630-4.

Chen, Y.; Schneider, R.; Wang, S.Y.; Kem, R.S.; Chen, C.H.; Kuo, C.P., "Dislocation reduction in GaN thin films via lateral overgrowth from trenches." Applied Physics Letters, v 75, n 14, Oct. 4, 1999, p. 2062-3.

Dadgar, A.; Poschenrieder, M.; Blasing, J.; Contreras, O.; Bertram, F.; Riemann, T.; Reiher, A.; Kunze, M.; Daumiller, I; Krtschil, A.; Diez, A.; Kaluza, A.; Modlich, A.; Kamp. M.; Christen, J.; Ponce, F.A.; Kohn, E.; Krost, A., "MOVPE growth of GaN on Si(111) substrates," Journal of Crystal Growth, v 248, Feb. 1, 2003, p. 556-62.

Davis, R.F.; Nam, O.-H.; Bremser, M.D.; Zheleva, T., "Lateral epitaxial overgrowth of and defect reduction in GaN thin films," *Lasers and Electro-Optics Society Annual Meeting, 1998. LEOS '98. IEEE*, vol. 1, No. pp. 360-361 vol. 1, Dec 1-4, 1998.

Dong-Ho Kim; Jaehoon Kim; Chi Cho; Heonsu Jeon, "GaN nano epitaxial lateral overgrowth on holographically patterned," *Compound Semiconductors, 2003. International Symposium on*, pp. 27-28, Aug. 25-27, 2003.

Feltin, E.; Beaumont, B.; Vennegues, P.; Vaille, M.; Gibart, P.; Riemann, T.; Christen, J.; Dobos, L..; Pecz, B., "Epitaxial lateral overgrowth of GaN on Si (111)," Journal of Applied Physics, v 93, n 1, Jan. 1, 2003, p. 182-5.

Fitzgerald et al., "Elimination of Dislocations in Heteroepitaxial MBE and RTCVD $Ge_xSi_{1-x}$ Grown on Patterned Si Substrates," *Journal of Electronic Materials*, vol. 19, No. 9 (1990), pp. 949-955.

Fitzgerald et al., "Epitaxial Necking in GaAs Growth on Pre-patterned Si Substrates," *Journal of Electronic Materials*, vol. 20, No. 10 (1991), pp. 839-853.

Fitzgerald et al., "Nucleation Mechanisms and the Elimination of Misfit Dislocations at Mismatched Interfaces by Reduction in Growth Areas," *J. Applied Phys.*, vol. 65, No. 6, (Mar. 15, 1989), pp. 2220-2237.

Fitzgerald, "The Effect of Substrate Growth Area on Misfit and Threading Dislocation Densities in Mismatched Heterostructures," *J. Vac. Sci. Technol.* vol. 7, No. 4 (Jul./Aug. 1989), pp. 782-788.

Hersee, et al., "The Controlled Growth of GaN Nanowires," *Nano Letters*, vol. 6, No. 8 (2006), pp. 1808-1811.

Hiramatsu, K.; Nishiyama, K.; Onishi, M.; Mizutani, H.; Narukawa, M.; Motogaito, A.; Miyake, H.; Iyechika, Y.; Maeda, T., "Fabrication and characterization of low defect density GaN using facet-controlled epitaxial lateral overgrowth (FACELO)," Journal of Crystal Growth, v 221, Dec. 2000, p. 316-26.

Hollander et al., "Strain and Misfit Dislocation Density in Finite Lateral Size $Si_{1-x}Ge_x$ Films Grown by Selective Epitaxy," *Thin Solid Films*, vol. 292, (1997) pp. 213-217.

International Search Report for Patent Application No. PCT/US2006/019152, dated May 17, 2005.

Ipri, A.C.; Jastrzebski, L.L., "MONO/POLY technology for fabricating low-capacitance CMOS integrated circuits," *Electron Devices, IEEE Transactions on*, vol. 35, No. 8pp.1382-1383, Aug. 1988.

Jing Wang; Guo, L.W.; Jia, H.Q.; Wang, Y.; Xing, Z.G.; Li, W.; Chen, H.; Zhou, J.M., "Fabrication of patterned sapphire substrate by wet chemical etching for maskless lateral overgrowth of GaN," Journal of the Electrochemical Society, v 153, n 3, Mar. 2006, p. C182- 5.

Ju, W.; Gulino, D.A.; Higgins, R. , "Epitaxial lateral overgrowth of gallium nitride on silicon substrate," Journal of Crystal Growth, v 263, n 1-4, Mar. 1, 2004, p. 30-4.

Kamiyama, S.; Iida, K.; Kawashima, T.; Kasugai, H.; Mishima, S.; Honshio, A.; Miyake, Y.; Iwaya, M.; Amano, H.; Akasaki, I., "UV laser diode with 350.9-nm-lasing wavelength grown by hetero-epitaxial-lateral overgrowth technology," *Selected Topics in Quantum Electronics, IEEE Journal of*, vol. 11, No. 5pp. 1069-1073, Sep.-Oct. 2005.

Kamiyama, S.; Iwaya, M.; Takanami, S.; Terao, S.; Miyazaki, A.; Amano, H.; Akasaki, I., "UV light-emitting diode fabricated on hetero-ELO-grown $Al_{0.22}Ga_{0.78}N$ with low dislocation density," Physica Status Solidi A, v 192, n 2, Aug. 2002, p. 296-300.

Kidoguchi, I.; Ishibashi, A.; Sugahara, G.; Ban, Y., "Air-bridged lateral epitaxial overgrowth of GaN thin films," Applied Physics Letters, v 76, n 25, Jun. 19, 2000, p. 3768-70.

Knall et al., Threading Dislocations in GaAs Grown with Free Sidewalls on Si mesas, *J Vac. Sci. Technol. B*, vol. 12, No. 6, (Nov./Dec. 1994) pp. 3069-3074.

Krost et al., "GaN-based Optoelectronics on Silicon Substrates," *Materials Science & Engineering*, B93 (2002) pp. 77-84.

Kushida, K.; Takeuchi, H., "Epitaxial growth of $PbTiO_3$ films on $SrTiO_3$ by RF magnetron sputtering," *Ultrasonics, Ferroelectrics and Frequency Control, IEEE Transactions on*, vol. 38, No. 6pp. 656-662, Nov. 1991.

Langdo et al., "High Quality Ge on Si by Epitaxial Necking" *Applied Physics Letters*, vol. 76, No. 25, (Jun. 19, 2000), pp. 3700-3702.

Lee et al., "Strain-relieved, Dislocation-free $In_xGa_{1-x}As/GaAs(001)$ Heterostructure by Nanoscale-patterned Growth," *Applied Physics Letters*, vol. 85, No. 18 (Nov. 1, 2004), pp. 4181-4183.

Lee, S.C.; Sun, X.Y.; Hersee, S.D.; Lee, J.; Ziang, Y.-B.; Xu, H.; Brueck, S.R.J., "Growth of GaN on a nanoscale periodic faceted Si substrate by metal organic vapor phase epitaxy," *Compound Semiconductors: Post-Conference Proceedings, 2003 International Symposium on*, vol., No.pp. 15- 21, Aug. 25-27, 2003.

Li et al., "Heteropitaxy of High-quality Ge on Si by Nanoscale Ge seeds Grown through a Thin Layer of $SiO_2$," *Applied Physics Letters*, vol. 85, No. 11, (Sep. 13, 2004), pp. 1928-1930.

Li et al., "Morphological Evolution and Strain Relaxation of Ge Islands Grown on Chemically Oxidized Si(100) by Molecular-beam Epitaxy," *Journal of Applied Physics*, vol. 98, (2005), pp. 073504-1-073504-8.

Li et al., "Selective Growth of Ge on Si(100) through Vias of $Sio_2$ Nanotemplate Using Solid Source Molecular Beam Epitaxy," *Applied Physics Letters*, vol. 83, No. 24 (Dec. 15, 2003), pp. 5032-5034.

Liang et al., "Critical Thickness Enhancement of Epitaxial SiGe films Grown on Small Structures," *Journal of Applied Physics*, vol. 97, (2005) pp. 043519-1-043519-7.

Liu et al., "High Quality Single-crystal Ge on Insulator by Liquid-phase Epitaxy on Si Substrates," *Applied Physics Letters*, vol. 84, No. 14, (Apr. 4, 2004) pp. 2563-2565.

Liu et al., "Rapid Melt Growth of Germanium Crystals with Self-Aligned Microcrucibles on Si Substrates," *Journal of The Electrochemical Society*, vol. 152, No. 8, 2005 G688-G693.

Lourdudoss, S.; Soderstrom, D.; Angulo Barrios, C.; Sun, Y.T.; Rodriguez Messmer, E., "Semi-insulating epitaxial layers for optoelectronic devices," *Semiconducting and Insulating Materials Conference, 2000. SIMC-XI. International*, vol., No.pp. 171-178, 2000.

Luan et al., "High-quality Ge Epilayers on Si with LowThreading-dislocation Densities," *Applied Phsics Letters*, vol. 75, No. 19, (Nov. 8, 1999) pp. 2909-2911.

Luan, "Ge Photodectors for Si Microphotonics," Ph.D. Thesis, Massachusetts Institute of Technology, Department of Materials Science & Engineering (Jan. 12, 2001).

Lubnow et al., "Effect of III/V-Compound Epitaxy on Si Metal-Oxide-Semiconductor Circuits," *Jpn. J. Applied Phys.*, vol. 33 (1994) pp. 3628-3634.

Luryi et al., "New Approach to the High Quality Epitaxial Growth of Latticed-mismatched Materials," *Appl. Phys. Lett.*, vol. 49, No. 3, (Jul. 21, 1986) 140-142.

Martinez et al., "Characterization of GaAs Conformal Layers Grown by Hydride Vapour Phase Epitaxy on Si Substrates by Microphotoluminescence Cathodoluminescence and microRaman," *Journal of Crystal Growth*, vol. 210 (2000) pp. 198-202.

Matsunaga et al., "A New Way to Achieve Dislocation-free Heteroepitaxial Growth by Molecular Beam Epitaxy: Vertical Microchannel Epitaxy," *Journal of Crystal Growth*, vol. 237-239 (2002) pp. 1460-1465.

Monroy, E.; Calle, F.; Munoz, E.; Beaumont, B.; Omnes, F.; Gibart, P., "High UV/visible contrast photodiodes based on epitaxial lateral overgrown GaN layers," *Electronics Letters*, vol. 35, No. 17 pp.1488-1489, Aug. 19, 1999.

Nakano, K.; Imura, M.; Narita, G.; Kitano, T.; Hirose, Y.; Fujimoto, N.; Okada, N.; Kawashima, T.; Iida, K.; Balakrishnan, K.; Tsuda, M.; Iwaya, M.; Kamiyama, S.; Amano, H.; Akasaki, I., "Epitaxial lateral overgrowth of AlN layers on patterned sapphire substrates," Source: Physica Status Solidi A, v 203, n 7, May 2006, p. 1632-5.

Nam et al., "Lateral Epitaxy of Low Defect Density GaN Layers via Organometallic Vapor Phase Epitaxy," *Appl. Phys. Letters*, vol. 71, No. 18, (Nov. 3, 1997) pp. 2638-2640.

Naol et al, "Epitaxial Lateral Overgrowth of GaN on Selected-area Si (111) Substrate with Nitrided Si Mask," *Journal of Crystal Growth*, vol. 248, (2003) pp. 573-577.

Neudeck, G.W.; Tai-Chi Su; Denton, J.P., "Novel silicon epitaxy for advanced MOSFET devices," *Electron Devices Meeting, 2000. IEDM Technical Digest. International*, vol., No. pp. 169-172, 2000.

Norman, A.G.; Hanna, M.C.; Romero, M.J.; Jones, K.M.; Al-Jassim, M.M., "Characterization of MOCVD lateral epitaxial overgrown III-V semiconductor layers on GaAs substrates," *Compound Semiconductors, 2003. International Symposium on*, vol., No.pp. 45-46, Aug. 25-27, 2003.

Parillaud et al. "High Quality InP on Si by Conformal Growth," *Appl. Phys. Lett.*, vol. 68, No. 19 (May 6, 1996) pp. 2654-2656.

Piffault, N.; Parillaud, O.; Gil-Hafon, E.; Leymarie, J.; Vasson, A.; Vasson, A.M.; Cadoret, R.; Gerard, B.; Pribat, D., "Assessment of the strain of InP films on Si obtained by HVPE conformal growth," *Indium Phosphide and Related Materials, 1994. Conference Proceedings., Sixth International Conference on*, vol., No.pp. 155-158, Mar. 27-31, 1994.

Pribat et al., "High Quality GaAs on Si by Conformal Growth," *Appl. Phys. Lett.*, vol. 60, No. 17 (Apr. 27, 1992) pp. 2144-2146.

Ren, D.; Wei Zhou; Dapkus, P.D., "Low-dislocation-density, nonplanar GaN templates for buried heterostructure lasers grown by lateral epitaxial overgrowth," Applied Physics Letters, v 86, n 11, Mar. 14, 2005, 111901-1-3.

Sangwoo Pae; Taichi Su; Denton, J.P.; Neudeck, G.W., "Multiple layers of silicon-on-insulator islands fabrication by selective epitaxial growth," *Electron Device Letters, IEEE*, vol. 20, No. 5 pp. 194-196, May 1999.

Schaub, J.D.; Li, R.; Schow, C.L.; Campbell, J.C.; Neudeck, G.W.; Denton, J., "Resonant-cavity-enhanced high-speed Si photodiode grown by epitaxial lateral overgrowth," *Photonics Technology Letters, IEEE*, vol. 11, No. 12 pp. 1647-1649, Dec 1999.

Shahidi , G.; Davari, B.; Taur, Y.; Warnock, J.; Wordeman, M.R.; McFarland, P.; Mader, S.; Rodriguez, M.; Assenza, R.; Bronner, G.; Ginsberg, B.; Lii, T.; Polcari, M.; Ning, T.H., "Fabrication of CMOS on ultrathin SOI obtained by epitaxial lateral overgrowth and chemical-mechanical polishing," *Electron Devices Meeting, 1990. Technical Digest., International*, vol., No.pp. 587-590, Dec 9-12, 1990.

Siekkinen, J.W.; Klaasen, W.A.; Neudeck, G.W., "Selective epitaxial growth silicon bipolar transistors for material characterization," *Electron Devices, IEEE Transactions on*, vol. 35, No. 10pp. 1640-1644, Oct. 1988.

Su et al., "Catalytic Growth of Group III-nitride Nanowires and Nanostructures by Metalorganic Chemical Vapor Deposition," *Applied Physics Letters*, vol. 86 (2005) pp. 013105-1-013105-3.

Sun, Y.; Messmer, E.R.; Soderstrom, D.; Jahan, D.; Lourdudoss, S., "Temporally resolved growth of InP in the openings off-oriented from [110] direction," *Indium Phosphide and Related Materials, 2000. Conference Proceedings. 2000 International Conference on*, vol., No.pp. 227-230, 2000.

Sun, Y.T.; Baskar, K.; Berggren, J.; Lourdudoss, S., "InGaAsP multi-quantum wells at 1.5 /spl mu/m wavelength grown on indium phosphide templates on silicon," *Indium Phosphide and Related Materials, 2003. International Conference on*, vol., No.pp. 277-280. May 12-16, 2003.

Sun,Y.T.; Lourdudoss, S., "Sulfur doped indium phosphide on silicon substrate grown by epitaxial lateral overgrowth," *Indium Phosphide and Related Materials, 2004. 16th IPRM. 2004 International Conference on*, pp. 334-337, May 31-Jun. 4, 2004.

Sun, Y.T.; Napierala, J.; Lourdudoss, S., "Selective area growth of InP on InP precoated silicon substrate by hydride vapor phase epitaxy," *Indium Phosphide and Related Materials Conference, 2002. IPRM. 14th*, vol., No.pp. 339-342, 2002.

Suryanarayanan, G.; Khandekar, A.A.; Kuech, T.F.; Babcock, S.E., "Microstructure of lateral epitaxial overgrown InAs on (100) GaAs substrates," Applied Physics Letters, v 83, n 10, Sep. 8, 2003, p. 1977-9.

Taichi Su; Denton, J.P.; Neudeck, G.W., "New planar self-aligned double-gate fully-depleted P-MOSFETs using epitaxial lateral overgrowth (ELO) and selectively grown source/drain (S/D)," SOI Conference, 2000 IEEE International, vol., No.pp. 110-111, 2000.

Tamura et al., "Threading Dislocations in GaAs on Pre-patterned Si and in Post-patterned GaAs on Si," Journal of Crystal Growth, vol. 147, (1995) pp. 264-273.

Tanaka et al., "Structural Characterization of GaN Lateral Overgrown on a (111) Si Substrate," Applied Physics Letters, vol. 79, No. 7 (Aug. 13, 2001) pp. 955-957.

Tomiya, S.; Hino, T.; Goto, S.; Takeya, M.; Ikeda, M., "Dislocation related issues in the degradation of GaN-based laser diodes," Selected Topics in Quantum Electronics, IEEE Journal of, vol. 10, No. 6 pp. 1277-1286, Nov.-Dec. 2004.

Tran et al., "Growth and Characterization of InP on Silicon by MOCVD," Journal of Crystal Growth, vol. 121, (1992) pp. 365-372.

Tsang, W.; Olsson, N.; Logan, R.; Henry. C.; Johnson, L.; Bowers, J.; Long, J., "The heteroepitaxial ridge-overgrown distributed feedback laser," Quantum Electronics, IEEE Journal of, vol. 21, No. 6 pp. 519-526, Jun. 1985.

Tsaur, B.-Y.; McClelland, R.W.; Fan, J.C.C.; Gale, R.P.; Salerno, J.P.; Vojak, B.A.; Bozler, "Low-dislocation-density GaAs epilayers grown on Ge-coated Si substrates by means of lateral epitaxial overgrowth," Applied Physics Letters, v 41, n 4, Aug. 15, 1982, 347-9.

Tsuji et al., "Selective Epitaxial Growth of GaAs on Si with Strained Sort-period Superlattices by Molecular Beam Epitaxy under Atomic Hydrogen Irradiation," J. Vac. Sci. Technol. B., vol. 22, No. 3, (May/Jun. 2004) pp. 1428-1431.

Vanamu et al., "Epitaxial Growth of High-quality Ge Films on Nanostructured Silicon Substrates," Applied Physics Letters, vol. 88, (2006) pp. 204104-1-204104-3.

Vanamu et al., "Growth of High Quality Ge/$Si_{1-x}Ge_x$ on Nano-scale Patterned Si Structures," J. Vac. Sci. Techn. B, vol. 23, No. 4, (Jul./Aug. 2005) pp. 1622-1629.

Vanamu et al., "Heteroepitaxial Growth on Microscale Patterned Silicon Structures," Journal of Crystal Growth, vol. 280, (2005) pp. 66-74.

Vanamu et al., "Improving Ge/$Si_xGe_{1-x}$ Film Quality through Growth onto Patterned Silicon Substrates," Advances in Electronics Manufacturing Technolgy, (Nov. 8, 2004) pp. 1-4.

Wernersson et al., "InAs Epitaxial Lateral growth of W Marks," Journal of Crystal Growth, vol. 280 (2005) pp. 81-86.

Wuu, D.S.; Wang, W.K.; Wen, K.S.; Huang, S.C.; Lin, S.H.; Huang, S.Y.; Lin, C.F.; Horng, R.H., "Defect reduction and efficiency improvement of near-ultraviolet emitters via laterally overgrown GaN on a GaN/patterned sapphire template," Applied Physics Letters, v 89, n 16, Oct. 16, 2006, p. 161105-1-3.

Xie et al., "From Porous Si to Patterned Si Substrate: Can Misfit Strain Energy in a Continuous Heteroepitaxial Film Be Reduced?" J Va. Sci. Technol. B, vol. 8, No. 2, (Mar./Apr. 1990) pp. 227-231.

Yamaguchi et al., "Analysis for Dislocation Density Reduction in Selective Area Growth GaAs Films on Si Substrates," Appl. Phys. Lett. vol. 56, No., 1, (Jan. 1, 1990) pp. 27-29.

Yamamoto et al., "Optimization of InP/Si Heteroepitaxial Growth Conditions Using Organometallic Vapor Phase Epitaxy," Journal of Crystal Growth, vol. 96, (1989) pp. 369-377.

Yang et al., "Selective Area Deposited Blue GaN-InGaN Multiple-quantum Well Light Emitting Diodes over Silicon Substrates," Applied Physics Letter, vol. 76, No. 3, (Jan. 17, 2000) pp. 273-275.

Yingda Dong; Okuno, Y.L.; Mishra, U.K., "Selective area growth of InP through narrow openings by MOCVD and its application to InP HBT," Indium Phosphide and Related Materials, 2003. International Conference on, vol., No.pp. 389-392, May 12-16, 2003.

Yoon et al., "Selective Growth of Ge Islands on Nanometer-scale Patterned $SiO_2$/Si Substrate by Molecular Beam Epitaxy," Applied Physics Letters, vol. 89 (2006) pp. 063107-1 063107-3.

Zamir et al., "Thermal Microcrack Distribution Control in GaN Layers on Si Substrates by Lateral Confined Epitaxy," Applied Physics Letters, vol. 78, No. 3, (Jan. 15, 2001) pp. 288-290.

Zang, K.Y.; Wang, Y.D.; Chua, S.J.; Wang, L.S., "Nanoscale lateral epitaxial overgrowth of GaN on Si (111)," Applied Physics Letters, v 87, n 19, Nov. 7, 2005, p. 193106-1-3.

Zang, K.Y.; Wang, Y.D.; Chua, S.J.; Wang, L.S.; Tripathy, S.; Thompson, C.V., "Nanoheteroepitaxial lateral overgrowth of GaN on nanoporous Si(111)," Applied Physics Letters, v 88, n 14, Apr. 3, 2006, p. 141925.

Zela et al., "Single-crystalline Ge Grown Epitaxially on Oxidized and Reduced Ge/Si (100) Islands," Journal of Crystal Growth, vol. 263 (2004) pp. 90-93.

Zhang et al., "Removal of Threading Dislocations from Patterned Heteroepitaxial Semiconductors by Glide to Sidewalls," Journal of Electronic Materials, vol. 27, No. 11, (1998) pp. 1248-1253.

Zhang et al., Strain Status of Self-assembled InAs Quantum Dots, Applied Physics Letters, vol. 77, No. 9, (Aug. 28, 2000) pp. 1295-1297.

Zheleva, T.S.; Ok-Hyun Nam; Ashmawi, W.M.; Griffin, J.D.; Davis, R.F., "Lateral epitaxy and dislocation density reduction in selectively grown GaN structures," Journal of Crystal Growth, v 222, n 4, Feb. 2001, p. 706-18.

Zubia et al., "Initial Nanoheteroepitaxial Growth of GaAs on Si (100) by OMVPE." Journal of Electronic Materials, vol. 30, No. 7, (2001) pp. 812-816.

Epitaxial Lateral Overgrowth of GaAs on a Si Substrate, 28 Jap. J. App. Physics 3, pp. L337-L339 (Mar. 1989).

68 Applied Physics Letters 7, pp. 774-779 (1999). (trans. of relevant portions attached).

Chang et al., "Epitaxial Lateral Overgrowth of Wide Dislocation-Free GaAs on Si Substrates," Electrochemical Soc'y Proceedings, vol. 97-21, pp. 196-200.

de Boeck et al., "The fabrication on a novel composite GaAs/$SiO_2$ nucleation layer on silicon for heteroepitaxial overgrowth by molecular beam epitaxy," Mat. Sci. and Engineering, B9 (1991), pp. 137-141.

Gustafsson et al., "Cathodoluminescence from relaxed $Ge_xSi_{i-x}$ grown by heteroepitaxial lateral overgrowth," J. Crystal Growth 141 (1994), pp. 363-370.

Gustafsson et al., "Investigations of high quality $Ge_xSi_{i-x}$ grown by heteroepitaxial lateral overgrowth using cathodoluminescence," Inst. Phys. Conf. Ser. No. 134: Section 11, pp. 675- 678.

Kazi et al., "Realization of GaAs/AlGaAs Lasers on Si Substrates Using Epitaxial Lateral Overgrowth by Metalorganic Chemical Vapor Deposition," Jpn. J. Appl. Physics, vol. 40 (2001), pp. 4903-4906.

Kimura et al., "Vibronic Fine Structure Found in the Blue Luminescence from Silicon Nanocolloids," Jpn. J. Appl. Physics, vol. 38 (1999), pp. 609-612.

Naritsuka et al., "InP Layer Grown on (001) Silicon Substrate by Epitaxial Lateral Overgrowth," Jpn. J. Appl. Physics, vol. 34 (1995), pp. L1432-L1435.

Naritsuka et al., "Vertical Cavity Surface Emitting Laser Fabricated on GaAs Laterally Grown on Si Substrate," Electrochemical Soc'y Proc. vol. 97-21, pp. 86-90.

International Search Report and Written Opinion for Patent Application No. PCT/US2006/029247, dated May 7, 2007.

Sakai, "Defect Structure in Selectively Grown GaN films with low threading dislocation density," Appl. Physics Letters 71(16), pp. 2259-2261 (1997).

Sakai, "Transmission electron microscopy of defects in GaN films formed by epitaxial lateral overgrowth," 73 App. Physics Letters 4, pp. 481-483 (1998).

Sakawa et al., "Effect of Si Doping on Epitaxial Lateral Overgrowth of GaAs on GaAs-Coated Si Substrate," Jpn. J. Appl. Physics, vol. 31 (1992), pp. L359-L361.

Vetury et al., "First Demonstration of AlGaN/GaN Heterostructure Field Effect Transistor on GaN grown by lateral epitaxial overgrowth (ELO)," Inst. Phys. Conf. Ser. No. 162: Ch. 5, pp, 177-183.

Partial International Search for International Application No. PCT/US2006/033859, 7 pages.

Huang et al., "Electron and Hole Mobility Enhancement in Strained SOI by Wafer Bonding," 49 IEEE Trans. On Electron Devices 9, pp. 1566-1570(2002).

Rim et al., "Fabrication and mobility characteristics of ultra-thin strained Si Directly on Insulator (SSDOI) MOSFETs," 2003 IEDM Tech. Dig., pp. 49-52.

Yang et al., "High Performance CMOS Fabricated on Hybrid Substrate with Different Crystal Orientations," 2003 IEDM Tech. Dig., pp. 453-456.

Beckett et al., "Towards a reconfigurable nanocomputer platform," ACM Int'l. Conf. Proceeding Series, vol. 19, pp. 141-150 (2002).

Chau et al., "Opportunities and Challenges of III-V Nanoelectronics for Future High-Speed, Low Power Logic Applications," IEEE CSIC Digest, pp. 17-20 (2005).

Datta et al., "Silicon and III-V Nanoelectronics," IEEE Int'l. Conf. on Indium Phosphide & Related Mat., pp. 7-8 (2005).

Gallas et al, "Influence of Doping on Facet Formation at the $SiO_2$/Si Interface," Surface Sci. 440, pp. 41-48 (1999).

Geppert, L., "Quantum transistors: toward nanoelectronics," IEEE Spectrum, pp. 46-51 (Sep. 2000).

Glew et al., "New DFB grating structure using dopant-induced refractive index step," J. Crystal Growth 261 (2004) pp. 349-354.

Groenert et al., "Monolithic integration of room-temperature cw GaAs/AlGaAs lasers on Si substrates via relaxed graded GeSi buffer layers," 93 J. Appl. Phys. 362 (2003).

Gould et al., "Magnetic resonant tunneling diodes as voltage-controlled spin selectors," 241 Phys. Stat. Sol. (B) 3, pp. 700-703 (2004).

Hayafuji et al., Jap. J. Appl. Phys. 29, pp. 2371 (1990).

International Search Report and Written Opinion for Patent Application No. PCT/US2006/033859, dated Sep. 12, 2007.

Ishitani et al., "Facet Formation in Selective Silicon Epitaxial Growth," 24 Jap. J. Appl. Phys. 10, pp. 1267-1269 (1985).

Klapper, "Generation and Propagation of Dislocations During Crystal Growth," Mat. Chem. and Phys. 66, pp. 101-109 (2000).

Kwok K Ng, Complete Guide to Semiconductor Devices, 2nd ed., Chapter 18 (2002).

Langdo, "Selective SiGe Nanostructures," Ph.D. Thesis, Massachusetts Institute of Technology (2001).

Lim et al., "Facet Evolution in Selective Epitaxial Growth of Si by cold-wall ultrahigh vacuum chemical vapor deposition," J. Vac. Sci. Tech. B 22(2), p. 682 (2004).

Loo et al., "Successful Selective Epitaxial $Si_{1-x}Ge_x$ Deposition Process for HBT-BiCMOS and high Mobility Heterojunction pMOS Applications," 150 J. Electrochem. Soc'y 10, pp. G638-G647 (2003).

Reed et al., "Realization of a three-terminal resonant tunneling device: the bipolar quantum resonant tunneling transistor," 54 Appl. Phys. Letters 11, pp. 1034 (1989).

Ringel et al., "Single-junction InGaP/GaAs Solar Cells Grown on Si Substrates with SiGe Buffer Layers," Prog. Photovolt.: Res. & Appl. 2002; 10:417-426.

Seabaugh et al., "Promise of Tunnel Diode Integrated Circuits," Tunnel Diode and CMOS/HBT Integration Workshop, Dec. 9, 1999, Naval Research Laboratory.

Takasuka et al., "InGaAs/AlGaAs Quantum Wire DFB Buried HeteroStructure Laser Diode by One-Time Selective MOCVD on Ridge Substrate," 44 Jap. J. App. Phys. 4B (2005) pp. 2546-2548.

Takasuka et al., "AlGaAs/InGaAs DFB Laser by One-Time Selective MOCVD Growth on a Grating Substrate," 43 Jap. J. App. Phys. 4B (2004) pp. 2019-2022.

Tseng et al., "Effects of Isolation Materials on Facet Formation for Silicon Selective Epitaxial Growth," 71 Appl. Phys. Letters 16, pp. 2328 (1997).

Xu et al., "Spin-filter devices based on resonant tunneling antisymmetrical magnetic semiconductor hybrid structures," 84 App. Phys. Letters 11, pp. 1955-1957 (2004).

Yamaguchi et al., "GaAs Solar Cells Grown on Si Substrates for Space Use," Prog. Photovolt.: Res. Appl. 2001; 9:191-201.

Yamaguchi et al., Appl. Phys. Letters 53(23), pp. 2293 (1988).

Yamaguchi et al., "Super-high-efficiency Multi-junction Solar Cells," Prog. Photovolt.: Res. Appl. 2005; 13:125-132.

International Search Report and Written Opinion for International Application PCT/US2007/007373, dated Oct. 5, 2007.

IPRP for International Application PCT/US2006/019152, dated Nov. 20, 2007.

Bergman et al., "RTD/CMOS Nanoelectronic Circuits: Thin-Film InP-based Resonant Tunneling Diodes Integrated with CMOS Circuits," 20 Electron Device Letters 3 (1999).

Cloutier et al., "Optical gain and stimulated emission in periodic nanopatterned crystalline silicon," Nature Materials (Nov. 2005).

Feng et al., "Integration of Germanium-on-Insulator and Silicon MOSFETs on a Silicon Substrate," 27 Electron Device Letters 11 (2006).

Fischer et al., "Elastic stress relaxation in SiGe epilayers on patterned Si substrates," 75 J. Applied Physics 1 (1994).

Fischer et al., "State of stress and critical thickness of Strained Small-Area SiGe Layers," Phys. Stat. Sol. (a) 171 (1999).

Fitzgerald et al., "Structure and recombination in InGaAs/GaAs Heterostructures," 63 J. Applied Physics 3 (1988).

Fitzgerald et al., "Totally relaxed $Ge_xSi_{1-x}$ layers with low threading dislocation densities grown on Si substrates," 59 Applied Physics Letters 7 (1991).

Gibbon et al., "Selective-area low-pressure MOCVD of GaInAsP and Related Materials on Planar InP Substrates," Semicond. Sci. Tech. 8(1993).

Ismail et al., "High-quality GaAs on sawtooth-patterned Si substrates," 59 Applied Physics Letters 19 (1991).

Jain et al., "Stresses in strained GeSi stripes and quantum structures: calculation using the finite element method and determination using micro-Raman and other measurements," Thin Solid Films 292 (1997) pp. 218-226.

Neumann et al., "Growth of III-V resonant tunneling diode on Si substrate with LP-MOVPE," J. Crystal Growth 248 (2003).

Prost, W., ed., QUDOS Technical Report 2002-2004.

Sun et al., "Thermal strain in Indium Phosphide on silicon obtained by epitaxial lateral overgrowth," 94 J. Applied Physics 4 (2003).

Usuda et al., "Strain relaxation of strained-Si layers on SiGe-on-insulator (SGOI) structures after mesa isolation," App. Surface Sci. 224 (2004).

Usui et al., "Thick GaN Epitaxial Growth with Low Dislocation Density by Hydride Vapor Phase Epitaxy," 36 Jap. J. Applied Physics (1997).

Vescan et al., "Lateral confinement by low pressure chemical vapor deposition-based selective epitaxial growth of $Si_{1-x}Ge_x$/Si nanostructures," 81 J. Applied Physics 10 (1997).

Choi et al., "Monolithic Integration of Si MOSFET's and GaAs MESFET's," Electron Device Letters, v. EDL-7, No. 4 (1986).

Choi et al., "Monolithic Integration of GaAs/AlGaAs Double-Heterostructure LED's and Si MOSFETs, " Electon Device Letters, v. EDL-7, No. 9 (1986).

Choi et al., "Monolithic Integration of GaAs/AlGaAs LED and Si Driver Circuit," 9 Electron Device Letters 10 (1988).

Fiorenza et al., "Film Thickness Constraints for Manufacturable Strained Silicon CMOS," 19 Semiconductor Sci. Technol., pp. L4 (2004).

Hu et al., "Growth of Well-Aligned Carbon Nanotube arrays on Silicon Substrates using Porous Alumina Film as a Nanotemplate," 79 App. Physics Letters 19 (2001).

IPRP for International Application No. PCT/US2006/029247, mailed Feb. 7, 2008.

International Search Report and Written Opinion for International Application No. PCT/US2007/020181, dated Jan. 25, 2008.

International Search Report and Written Opinion for International Application No. PCT/US07/020777, mailed Feb. 8, 2008.

International Search Report and Written Opinion for International Application No. PCT/US2007/019568, mailed Feb. 6, 2008.

Rosenblad et al., "A Plasma Process for Ultrafast Deposition of SiGe Graded Buffer Layers," 76 Applied Physics Letters 4, pp. 427-429 (2000).

Shichijo et al., "Co-Integration of GaAs MESFET & Si CMOS Circuits," 9 Elec. Device Letters 9(1988).

Tamura et al., "Heteroepitaxy on high-quality GaAs on Si for Optical Interconnections on Si Chip," Proceedings of the SPIE, vol. 2400, pp. 128-139 (1995).

Bean et al., "$Ge_xSi_{1-x}$/Si strained-later superlattice grown by molecular beam epitaxy," J. Vac. Sci. Tech. A (2)2, pp. 436-440 (1984).

Blakeslee, "The Use of Superlattices to Block the Propogation of Dislocations in Semiconductors," Mat. Res. Soc. Symp. Proc. 148, pp. 217-227.

Currie et al., "Carrier Mobilities and Process Stability of Strained Si n- and p-MOSFETs on SiGe Virtual Substrates," J. Vac. Sci. Tech. B 19(6), pp. 2268-79 (2001).

Donaton et al., "Design and Fabrication of MOSFETs with a Reverse Embedded SiGe (Rev. e-SiGe) Structure," 2006 IEDM, pp. 465-468.

International Technology Roadmap for Semiconductors—Front End Processes, pp. 1-62 (2005).

IPRP for International Application No. PCT/US2006/033859, mailed Mar. 20, 2008.

Matthews et al., "Defects in Epitaxial Multilayers- Misfit Dislocations," J. Crystal Growth 27, pp. 118-125(1974).

Pidin et al., "MOSFET Current Drive Optimization Using Silicon Nitride Capping Layer for 65-nm Technology Node," 2004 Symp. On VLSI Technology, Dig. Tech. Papers, pp. 54-55.

Rim et al., "Enhanced Hole Mobilities in Surface-channel Strained-Si p-MOSFETs," 1995 IEDM, pp. 517-520.

Thean et al., "Uniaxial-Biaxial Hybridization for Super-Critical Strained-Si Directly on Insulator (SC-SSOI) PMOS with Different Channel Orientations," IEEE, pp. 1-4 (2005).

Thompson et al., "A Logic Nanotechnology Featuring Strained-Silicon," 25 IEEE Electron Device Letters 4, pp. 191-193 (2004).

Yin et al., "Ultrathin Strained-SOI by Stress Balance on Compliant Substrates and FET Performance," 52 IEEE Trans. on Electron Devices 10, pp. 2207-2214 (2005).

Examination Report in European Patent Application No. 06800414.2, mailed Mar. 5, 2009 (3 pages).

International Preliminary Report on Patentability for International Application No. PCT/US07/021023, mailed Apr. 9, 2009 (8 pages).

International Preliminary Report on Patentability for International Application No. PCT/US2007/020181, mailed Apr. 2, 2009.

International Preliminary Report on Patentability for International Application No. PCT/US07/020777, mailed Apr. 9, 2009 (12 pages).

Partial International Search Report for International Application No. PCT/US2008/068377, mailed Apr. 7, 2009.

International Search Report and Written Opinion for International Application No. PCT/US07/022392, mailed Apr. 11, 2008.

International Preliminary Report on Patentability for International Application No. PCT/US07/022392, mailed Apr. 30, 2009 (14 pages).

International Search Report and Written Opinion for International Application No. PCT/US2008/068377, mailed Jul. 6, 2009 (19 pages).

International Preliminary Report on Patentability for International Application No. PCT/US2007/019568, mailed Mar. 10, 2009 (7 pages).

International Search Report and Written Opinion for International Application No. PCT/US07/022392, mailed Apr. 11, 2008.

* cited by examiner

LATTICE-MISMATCHED SEMICONDUCTOR STRUCTURES ON INSULATORS

FIELD OF THE INVENTION

This invention relates generally to lattice-mismatched semiconductor heterostructures and, specifically, to methods and materials for formation of integrated structures including alternative active-area materials on insulators.

BACKGROUND OF THE INVENTION

The increasing operating speeds and computing power of microelectronic devices have recently given rise to the need for an increase in the complexity and functionality of the semiconductor structures from which these devices are fabricated. Hetero-integration of dissimilar semiconductor materials, for example, III-V materials, such as gallium arsenide, gallium nitride, indium aluminum arsenide, and/or germanium with silicon, silicon-on-insulator, or silicon-germanium substrates, is an attractive path for increasing the functionality and performance of the CMOS platform. Specifically, as geometric scaling of Si-based MOSFET technology becomes more challenging, the heterointegration of alternative area materials becomes an attractive option for increasing the innate carrier mobility of MOSFET channels. For many applications, it is desirable to incorporate alternative active-area materials having a low density of dislocation defects onto an insulator platform. As used herein, the term "alternative materials" refers to either a non-silicon semiconductor, or silicon with a different surface or rotational orientation compared to the underlying substrate. Such areas are suitable for use as active areas for MOSFETs or other electronic or opto-electronic devices.

Heterointegration of alternative materials has thus far been typically limited to the addition of SiGe alloys of small Ge content for use as source-drain contact materials or heterojunction bipolar transistor base layers. Since such layers are only slightly lattice-mismatched to Si, and since most modern Si MOSFET processes are compatible with these dilute SiGe alloys, few disruptions in the Si MOSFET integration sequence have been necessary. The drive for increased carrier mobility—and concomitant device drive current—will soon, however, necessitate the use of other, more highly lattice-mismatched materials for historically Si-based devices, requiring more disruptive changes to the traditional device integration flow.

In particular, heteroepitaxial growth can be used to fabricate many modern semiconductor devices where lattice-matched substrates are not commercially available or to potentially achieve monolithic integration with silicon microelectronics. Performance and, ultimately, the utility of devices fabricated using a combination of dissimilar semiconductor materials, however, depends on the quality of the resulting structure. Specifically, a low level of dislocation defects is important in a wide variety of semiconductor devices and processes, because dislocation defects partition an otherwise monolithic crystal structure and introduce unwanted and abrupt changes in electrical and optical properties. These, in turn, result in poor material quality and limited performance. In addition, the threading dislocation segments can degrade physical properties of the device material and can lead to a premature device failure.

As mentioned above, dislocation defects typically arise in efforts to epitaxially grow one kind of crystalline material on a substrate of a different kind of material—often referred to as a "heterostructure"—due to different crystalline lattice sizes of the two materials. This lattice mismatch between the starting substrate and subsequent layer(s) creates stress during material deposition that generates dislocation defects in the semiconductor structure. The stress field associated with misfit dislocations under certain conditions may cause formation of linear agglomerations of threading dislocations, termed a "dislocation pile-up." This is generally defined as an area comprising at least three threading dislocations, with a threading dislocation density greater than $5 \times 10^6$ cm$^{-2}$, and with threading dislocations substantially aligned along a slip direction such that the linear density of dislocations within the pile-up and along a slip direction is greater than 2000/cm. For example, the slip directions in SiGe materials are in-plane <110> directions. A high localized threading dislocation density present in dislocation pile-ups has a potentially devastating impact on the yield of devices formed in these regions and may render these devices unusable. Inhibiting the formation of dislocation pile-ups is, therefore, desirable.

To minimize formation of dislocations and associated performance issues, as mentioned above, many semiconductor heterostructure devices known in the art have been limited to semiconductor layers that have very closely—e.g. within 0.1%—lattice-matched crystal structures. In such devices a thin layer is epitaxially grown on a mildly lattice-mismatched substrate. As long as the thickness of the epitaxial layer is kept below a critical thickness for defect formation, the substrate acts as a template for growth of the epitaxial layer, which elastically conforms to the substrate template. While lattice-matching and near-matching eliminate dislocations in a number of structures, there are relatively few lattice-matched systems with large energy band offsets, limiting the design options for new devices.

Accordingly, there is considerable interest in heterostructure devices involving greater epitaxial layer thickness and greater lattice misfit than known approaches would allow. One known technique termed "epitaxial necking" was demonstrated in connection with fabricating a Ge-on-Si heterostructure by Langdo et al. in "High Quality Ge on Si by Epitaxial Necking," Applied Physics Letters, Vol. 76, No. 25, Apr. 2000. This approach offers process simplicity by utilizing a combination of selective epitaxial growth and defect crystallography to force defects to the sidewall of the opening in the patterning mask, without relying on increased lateral growth rates. This approach, however, generally requires relatively thick semiconductor layers, as well as relatively small lateral dimensions of the openings in the mask in order for the dislocations to terminate at its sidewalls, resulting in defect-free regions.

Several methods to fabricate non-Si semiconductors on insulator substrates have been previously reported, whereby transfer of SiGe material onto insulator substrate was achieved through bonding and splitting induced by hydrogen implantation and annealing. Generally, in these approaches, a relatively thick SiGe layer is deposited on a silicon substrate, which includes a graded SiGe buffer layer and a relaxed SiGe layer having a constant germanium concentration. Following surface planarization, hydrogen is implanted into the SiGe layer to facilitate wafer splitting. The Si/SiGe wafer is then bonded to an oxidized silicon substrate. The SiGe-on-oxide layers are separated from the rest of the couplet by thermal annealing, wherein splitting occurs along hydrogen-implantation-induced microcracks, which parallel the bonding interface.

A technique to form a SiGe-free strained silicon-on-insulator substrates has been also reported by T. A. Langdo and others in "Preparation of Novel SiGe-Free Strained Si on Insulator Substrates," published in 2002 IEEE International SOI Conference Proceedings (Oct. 2002). This technique is similar to approaches described above, except that a thin layer of epitaxial silicon is deposited on the SiGe layer before wafer bonding. After bonding and wafer splitting, the SiGe layer is removed by oxidation and HF etching, enabling the formation of very thin and uniform strained silicon-on-oxide surface.

Thus, there is a need in the art for versatile and efficient methods of fabricating semiconductor heterostructures, including alternative active-area materials disposed over a common insulator platform, that would address formation of interface defects in a variety of lattice-mismatched materials systems. There is also a need in the art for semiconductor devices utilizing a combination of integrated lattice-mismatched materials with reduced levels of substrate interface defects for improved functionality and performance.

SUMMARY OF THE INVENTION

Heterointegration of alternative materials is desirable for various electronic and optoelectronic applications. For example, the heterointegration of III-V, II-VI materials and/or Ge with Si is an attractive path for increasing the functionality and performance of the CMOS platform. An economical solution to heterointegration could enable new fields and applications, such as replacing Si in CMOS transistors, particularly for critical-path logic devices. Heterointegration could significantly lower (a) channel resistance, due to the ultra-high mobility and saturation velocity afforded by various non-Si semiconductors, and (b) source/drain resistance, due both to high mobility and to the narrower bandgap of many non-Si semiconductors, with the narrower bandgap leading to a lower electrical resistance between the metal (or metal-alloy) contact and the semiconductor. Another new application could be the combination of Si CMOS logic with ultra-high speed RF devices, such as InP- or GaAs-based high electron-mobility transistor (HEMT) or heterojunction bipolar transistor (HBT) devices similar to those utilized for high-frequency applications today. Yet another application may be the combination of Si CMOS logic with opto-electronic devices, since many non-Si semiconductors have light emission and detection performance superior to Si.

Selective epitaxy is an attractive path for hetero-materials integration for several reasons. First, it facilitates adding the non-Si semiconductor material only where it is needed, and so is only marginally disruptive to a Si CMOS process performed on the same wafer. Also, selective epitaxy may allow multiple new materials to be combined on a common wafer, e.g., Ge for PMOS and InGaAs for NMOS. Furthermore, it is likely to be more economical than key alternative paths, e.g., layer transfer of global hetero-epitaxial films, especially for integrating materials with large lattice mismatch. In order to achieve integration of lattice-mismatched materials on an insulator, selective epitaxy can be supplemented by techniques employing ion implantation and bonding.

Accordingly, it is an object of the present invention to provide on-insulator semiconductor heterostructures with significantly minimized dislocation defects, and methods for their fabrication employing selective epitaxy and bonding.

As mentioned above, dislocation defects typically arise during epitaxial growth of one kind of crystal material on a substrate of a different kind of material due to differences in crystalline lattice sizes. This lattice mismatch between the starting substrate and subsequent layer(s) creates stress during material deposition that generates dislocation defects in the semiconductor structure. One known technique to control threading dislocation densities ("TDD") in highly-mismatched epitaxial layers involves substrate patterning, which exploits the fact that the threading dislocations are constrained by geometry (i.e. that a dislocation cannot end in a crystal). If the free edge is brought closer to another free edge by patterning the substrate into growth areas, then it is possible to generally confine threading dislocations to a portion of the epitaxial layer proximate to its interface with the starting substrate, thereby minimizing the TDD in the remainder of the epitaxial layer.

Generally, in its various embodiments, the invention disclosed herein focuses on bonding patterned substrates with alternative active-area materials epitaxially formed thereon to a rigid platform, such as, for example, an insulator disposed over a handle wafer, and then removing the highly-defective interface areas along with the underlying substrates to produce alternative active-area regions disposed over the insulator and substantially exhausted of misfit and threading dislocations. As a result, the invention contemplates fabrication of semiconductor devices based on monolithic lattice-mismatched heterostructures on insulators long sought in the art but heretofore impractical due to dislocation defects.

In general, in one aspect, the invention disclosed herein features methods for forming a structure, including providing a first substrate including, or consisting essentially of, a first crystalline semiconductor material. A first insulator layer is formed over the first substrate, and at least one opening is defined in the first insulator layer extending to the first substrate. The opening is filled, at least partially, with an active-area material by, for example, selective epitaxy to form an active-area region surrounded by an insulator region. The method further includes forming a cleave area at a predetermined distance in relation to the interface between the first substrate and the active-area regions by, for example, implanting gaseous material into the active-area and the insulator regions. The active-area and the insulator regions are then bonded to a rigid platform, for example, a structure including a second insulator layer disposed over a second substrate including, or consisting essentially of, a second crystalline semiconductor material. The method further includes causing the bonded structure to split at least along the cleave area into a first portion and a second portion, the second portion including at least a portion of the active-area region bonded to the second insulator layer.

In various embodiments, the split within the bonded structure is caused by thermal annealing, e.g. at a temperature ranging from about 350° C. to 700° C. Optionally, a surface of the active-area region is planarized prior to implantation and bonding such that its surface is substantially coplanar with a surface of the insulator region. Also, following the split, an exposed surface of the second portion can be planarized to remove cleave-induced surface roughness and, if desired, reduce a thickness of the active-area region in the second portion to a desired value. In some embodiments, the second portion is annealed after the split at a temperature ranging from about 600° C. to about 900° C.

In some embodiments, the cleave area at least partially lies within the active-area and the insulator regions substantially parallel to the interface between the first substrate and the active-area region at a first predetermined distance therefrom, such that, following the split, the first portion includes portions of the active-area and the insulator regions disposed over the first substrate. In some implementations of these embodiments, a strained region is formed within the active-area region, such that the cleave area at least partially includes the strained region. In other embodiments, the cleave area at least partially lies within the first substrate substantially parallel to the interface between the first substrate and the active-area region at a second predetermined distance therefrom, such that, after causing the bonded structure to split into the first portion and the second portion, the second portion of the bonded structure includes a portion of the first substrate. Optionally, the remaining first crystalline semiconductor material is removed from the active-area and the insulator regions by post-annealing planarization and/or etching. In yet another embodiment of this aspect of the invention, the active-area material is epitaxially grown over the first substrate in a bottom portion of the opening, and then a third insulator layer is deposited in a top portion of the opening over the active-area material. The surface of the third insulator layer can be planarized prior to implantation and bonding such that the surface is substantially coplanar with a surface of the insulator region. In still other embodiments, the cleave area substantially coincides with or is proximate to the interface between the active-area material and the first substrate, such that the cleave area at least partially includes the interface between the first substrate and the active-area region.

Optionally, a strained semiconductor layer is deposited over the surface of the active-area region. Also, in some embodiments, prior to implantation and bonding, a dielectric material is deposited over the active-area material in the opening to form a buffer region above the active-area region. A surface of the buffer region extends at least to a surface of the first insulator layer. The surface of the buffer region is or can be made co-planar with the surface of the first insulator layer.

In this and other aspects of the invention, the rigid platform may include one or more layers of glass, quartz, plastic, polymer, or other dielectric material, either self-supporting or disposed over another layer. For example, the rigid platform can be a substrate including a second insulator layer disposed over a second substrate including, or consisting essentially of, a second crystalline semiconductor material. The first semiconductor and/or second semiconductor materials include, or consist essentially of, single-crystal silicon, germanium, a silicon-germanium alloy, and/or a III-V material. The first and second substrates may be, for example, a bulk silicon wafer, a bulk germanium wafer, a bulk III-V wafer such as gallium arsenide or indium phosphide, a semiconductor-on-insulator (SOI) substrate, or a strained semiconductor-on-insulator (SSOI) substrate. Also, the first and second insulator layers may include, or consist essentially of, silicon dioxide, aluminum oxide, silicon nitride, silicon carbide, and/or diamond, and may have a thickness of, e.g., 50-1000 nanometers. The third insulator layer can include, or consist essentially of, either the same material as the first and second insulator layers, or include a different material, such as, for example, a low-K dielectric material. Generally, the active-area material is a crystalline semiconductor material, such as a group IV element or compound, a III-V compound, and/or a II-VI compound. The group IV element may be carbon, germanium, and/or silicon, e.g., (110) silicon. The group IV compound may include silicon, germanium, tin, and/or carbon, e.g., silicon germanium (SiGe). The III-V compound may be, e.g., gallium arsenide (GaAs), indium arsenide (InAs), indium gallium arsenide (InGaAs), indium phosphide (InP), or indium antimonide (InSb), gallium nitride (GaN), and/or indium nitride (InN). The II-VI compound may be, e.g., zinc telluride (ZnTe), cadmium selenide (CdSe), cadmium telluride (CdTe), zinc sulfide (ZnS), and/or zinc selenide (ZnSe). Also, the first crystalline semiconductor material may have a first crystalline orientation and the active-area material comprises a third crystalline semiconductor material having a second crystalline orientation different from the first crystalline orientation. For example, the first crystalline semiconductor material may be (100) silicon and the active-area material may be (110) silicon. The gaseous material may include ions of hydrogen, helium, argon, krypton, and/or neon.

In general, in another aspect, the invention relates to a semiconductor structure that includes a substrate and, thereover, a patterned insulator layer defining at least one opening. The substrate can be a rigid platform that includes one or more layers of glass, quartz, plastic, polymer, or other dielectric material, either self-supporting or disposed over another layer, for example, including, or consisting essentially of, a crystalline semiconductor material. The structure further includes an active-area region formed in the opening and bonded to the substrate. The active-area region includes, or consists essentially of, an active-area material substantially exhausted of misfit and threading dislocations.

Various embodiments of this and other aspects of the invention include one or more of the following features. The substrate may include a base insulator layer disposed over the crystalline semiconductor material underneath the patterned insulator layer. The active-area region may have a buffer region that includes, or consists essentially of, a dielectric material and is disposed in the opening between the substrate and the active-area material. The active-area region may also have a strained semiconductor layer disposed over the active-area material. A dislocation pile-up density in the active-area material does not exceed about 1/cm, for example, is less than about 0.01/cm. Also, a threading dislocation density in the active-area material does not exceed about $10^3$ cm$^{-2}$, for example, is less than about $10^2$ cm$^{-2}$.

In general, in other aspects, one or more electronic devices, such as, for example, a field-effect transistor (FET), such as a complementary metal-oxide-semiconductor FET (CMOSFET) or a metal-semiconductor FET (MESFET), or a non-FET device such as a diode, are defined including at least a portion of one or more of the active-area regions.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

In accordance with its various embodiments, the invention disclosed herein contemplates fabrication of monolithic lattice-mismatched semiconductor heterostructures disposed over an insulator platform with limited-area regions substantially exhausted of misfit and threading dislocations, as well as fabrication of semiconductor devices based on such lattice-mismatched heterostructures.

Figure 1A:
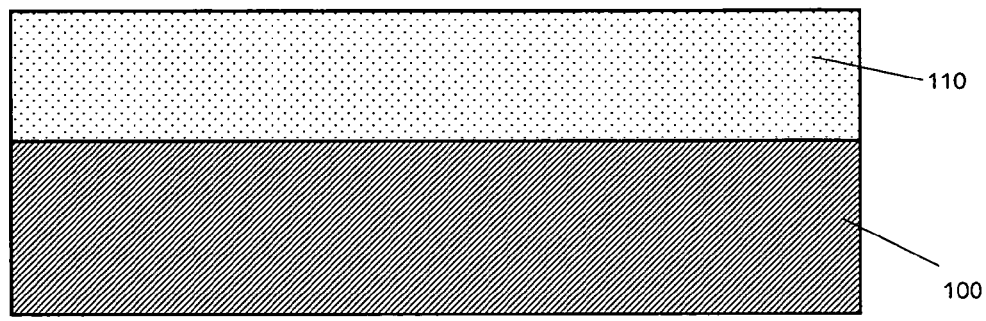
FIGS. 1A-1D, 2A-2C, 3A-3D, 4A-4B, and 5A-5C depict schematic cross-sectional side views illustrating formation of semiconductor structures including alternative active-area materials.
Figure 1B:
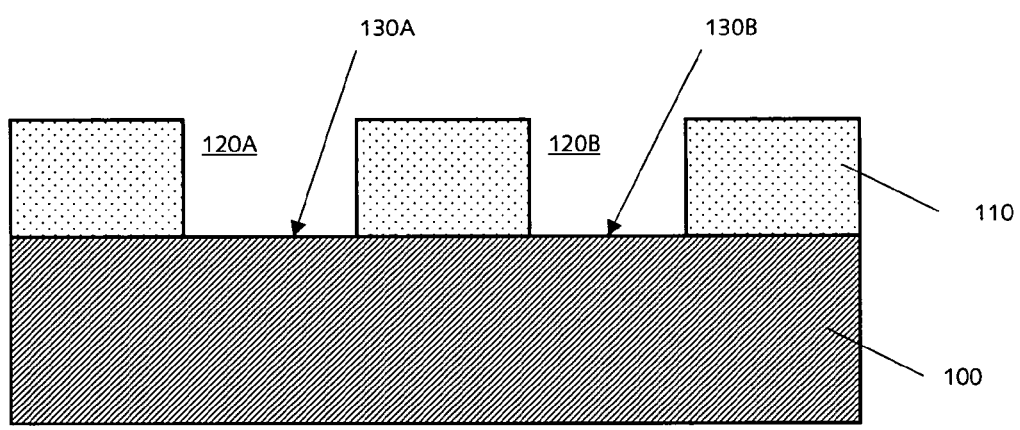
Figure 1C:
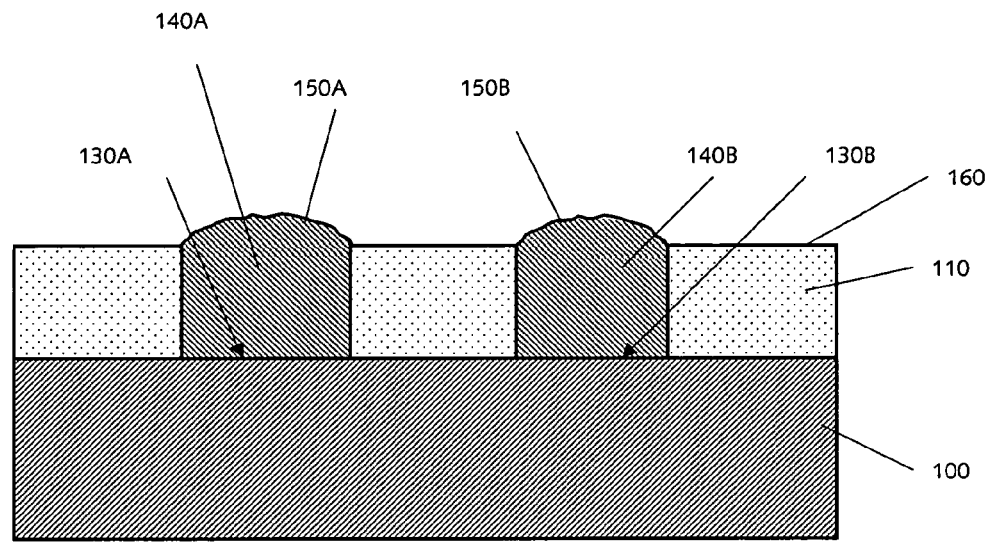

Referring to FIGS. 1A-1C, planar isolation regions may be utilized for the selective epitaxy of active-area materials. In one embodiment, a substrate 100 includes a crystalline semiconductor material. The substrate may be, for example, a bulk silicon wafer, a bulk germanium wafer, a bulk III-V wafer such as gallium arsenide or indium phosphide, a SOI substrate, or a SSOI substrate. An insulator layer 110 is formed over the substrate, as shown in FIG. 1A. The insulator layer may be, for example, silicon dioxide, aluminum oxide, silicon nitride, silicon carbide, or diamond, and may have a thickness of, e.g., 50-1000 nanometers (nm). The insulator layer may be formed by a deposition method, such as chemical vapor deposition (CVD), plasma-enhanced chemical vapor deposition (PECVD), or low-pressure chemical vapor deposition (LPCVD).

A mask (not shown), such as a photoresist mask, is formed over the insulator layer 110. The mask is patterned to expose at least a portion of the insulator layer. The exposed portion of the insulator layer is removed by, e.g., reactive ion etching (RIE), to define openings 120A and 120B and expose areas 130A and 130B of a top surface of the substrate 100, as shown in FIG. 1B. Each of the openings may have a width of, e.g., 50 nm-10 micrometers (μm) and a length of, e.g., 50 nm-10 μm. The height of the openings equals the thickness of the insulator layer. The openings correspond to the active areas of electronic or opto-electronic device(s) and the dimensions are selected accordingly.

Referring to FIGS. 1B-1C, in some embodiments, the openings 120A and 120B are filled with active-area materials by selective epitaxy, thereby forming active-area regions 140A and 140B surrounded by insulator regions of the insulator layer 110. Selective epitaxy may be performed by a deposition method such as atomic layer deposition (ALD) or CVD, for example, PECVD, LPCVD, ultra-high vacuum CVD, reduced-pressure CVD, or metalorganic CVD. Various deposition methods for forming active-area regions 140A and 140B may utilize techniques described in co-pending provisional application Ser. No. 60/681,940, incorporated herein by reference.

In many embodiments of the invention, the active-area regions 140A and 140B are formed selectively, i.e., the materials are deposited over the areas 130A, 130B of the crystalline semiconductor material of substrate 100 exposed by the openings, but are not substantially deposited or formed on the insulator layer 110. The active-area materials are crystalline semiconductor material, such as a group IV element or compound, a III-V compound, or a II-VI compound. The group IV element may be carbon, germanium, or silicon, e.g., (110) silicon. The group IV compound may include silicon, germanium, tin, or carbon, e.g., SiGe. The III-V compound may be, e.g., GaAs, InAs, InGaAs, InP, InSb, GaN, InN, or mixtures thereof. The II-VI compound may be, e.g., ZnTe, CdSe, CdTe, ZnS, and/or ZnSe. The active-area regions 140A and 140B may include, or consist essentially of, the same or different materials. Also, in some embodiments, one or more of the active-area regions may include, or consist essentially of, silicon. The lattice mismatch (or difference in equilibrium lattice constants) between the active-area materials and the crystalline semiconductor material of substrate 100 may, in some embodiments, exceed approximately 4%. In a particular embodiment, the lattice mismatch between the active-area materials and the crystalline semiconductor material of substrate is greater than approximately 8%. The density of misfit dislocations, which typically form as the active-area material relaxes to its equilibrium lattice constant and are present near the interface between the active-area material and the substrate, can exceed $1\times10^6$ $cm^{-2}$, even exceeding $2\times10^6$ $cm^{-2}$ or $4\times10^6$ $cm^{-2}$ in some embodiments. These misfit dislocation defects are linear defects generally lying parallel to the interface and generally confined to a thin region near the interface.

Figure 1D:
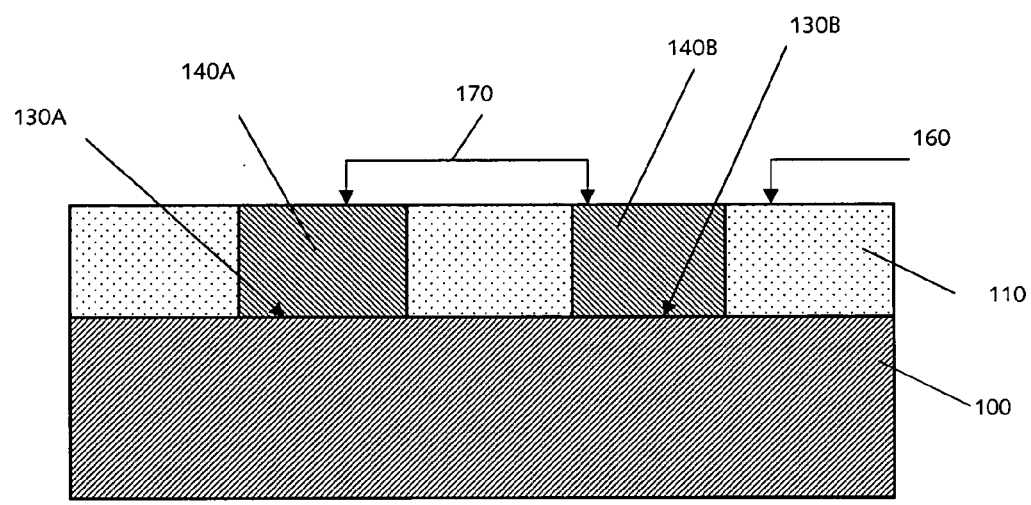

Referring to FIG. 1C, after the openings 120A and 120B are filled with the active-area materials, portions 150A and 150B of the active-area materials may extend above a top surface 160 of the insulator layer 110 for various reasons, thereby forming a non-planar top surface. For instance, facets may form at a vertical interface between the semiconductor active area material and the insulator. Even without facets, a top surface of the active-area regions 140A and 140B may not be co-planar with a top surface of the insulator material, because of the difficulty of stopping the selective epitaxy precisely at the point that the openings are filled with the active-area materials. A non-planar surface may present subsequent processing difficulties, for example, compromise bondability of the active-area regions. Referring now to FIG. 1D, to address these potential difficulties, the portions 150A, 150B of the active area regions extending above the top surface of the insulator layer may be removed by, for example, planarization, so that surface 170 of the active-area regions is substantially coplanar with the top surface of the insulator layer. The active area material surface may be planarized by, for example, a chemical-mechanical polishing (CMP) step that is selective with respect to the insulator layer.

Figure 2A:
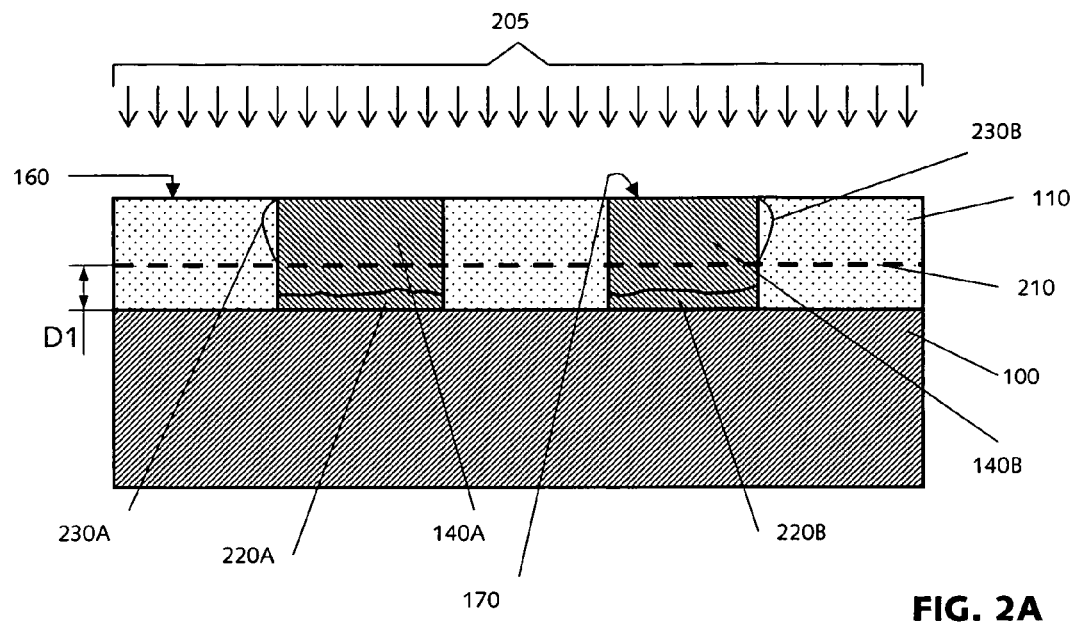

Referring now to FIG. 2A, in various embodiments, gaseous species 205 are introduced into the active-area regions 140A and 140B and the regions of the insulator layer 110 surrounding the active-area regions by, for example, ion implantation. The gaseous species may include, or consist essentially of, ions of hydrogen, helium, argon, krypton, and/ or neon. In a particular embodiment, the gaseous species consist essentially of $H^+$ ions. Implantation of the gaseous species is controlled such that the species penetrate the active-area and the insulator regions, forming a narrow cleave area 210 at a predetermined distance from the coplanar top surfaces 160, 170 of these regions. In one embodiment, the cleave area lies within the active-area and the insulator regions at a distance D1 above and substantially parallel to the interface between the substrate 100 and the active-area regions. The insulator regions may have smaller cross-sectional areas than the active-area regions 140A and 140B, and thus the cleaving behavior of the insulator regions will be substantially similar to that of the active-area regions. Additionally, after the split induced along the cleave area discussed in detail below, the insulator regions may function as isolation regions, e.g., shallow trench isolation regions, for devices subsequently formed in the active-area regions. The thickness of the cleave area depends on the parameters of the ion implantation, and, in many embodiments, is carefully controlled such that the cleave area is about 10-50% of the thickness of insulator layer 110. For example, for a thickness of insulator layer 110 of about 100 nm, the cleave area can be approximately 10-50 nm thick. In some embodiments, the implantation of the gaseous species to form cleave area 210 can be replaced or supplemented by another method of introducing gaseous species, such as diffusion or plasma-assisted gasification, e.g., plasma hydrogenation. As skilled artisans will appreciate, dislocation defects induced by the lattice mismatch between the crystalline semiconductor material of the substrate and the active-area material are generally concentrated in the active-area region proximate to the interface with the substrate. The heights of these highly-defective zones 220A, 220B of the active-area regions above the interface with the substrate 100 depends on, e.g., the degree of lattice mismatch between the materials, as well as epitaxial deposition conditions. By selecting the distance D1 to exceed the height of highly-defective zones 220A, 220B, portions 230A, 230B of the active-area region above the cleave area are substantially exhausted of misfit and threading dislocations. In one embodiment, portions 230A, 230B have a TDD at least three orders of magnitude lower than a TDD in the cleave area and/or highly-defective zones 220A, 220B. In another embodiment, portions 230A, 230B have a TDD at least five orders of magnitude lower than a TDD in the cleave area and/or the highly-defective zones. As skilled artisans readily appreciate, reduction in dislocation density of a semiconductor structure reduces leakage currents that contribute to the off-state current of a device formed thereon. Thus, as used herein, the active-area region being "substantially exhausted of misfit and threading dislocations" refers either to a complete absence of dislocations in this region or to the level thereof being sufficiently low so as not to meaningfully affect the performance of electronic device(s) at least partially incorporating this region. For example, in various embodiments of the invention, the off-state current of these devices is less than about $10^6$ A/µm, preferably, less than about $10^{-8}$ A/µm, and more preferably $10^{-10}$ A/µm.

Figure 2B:
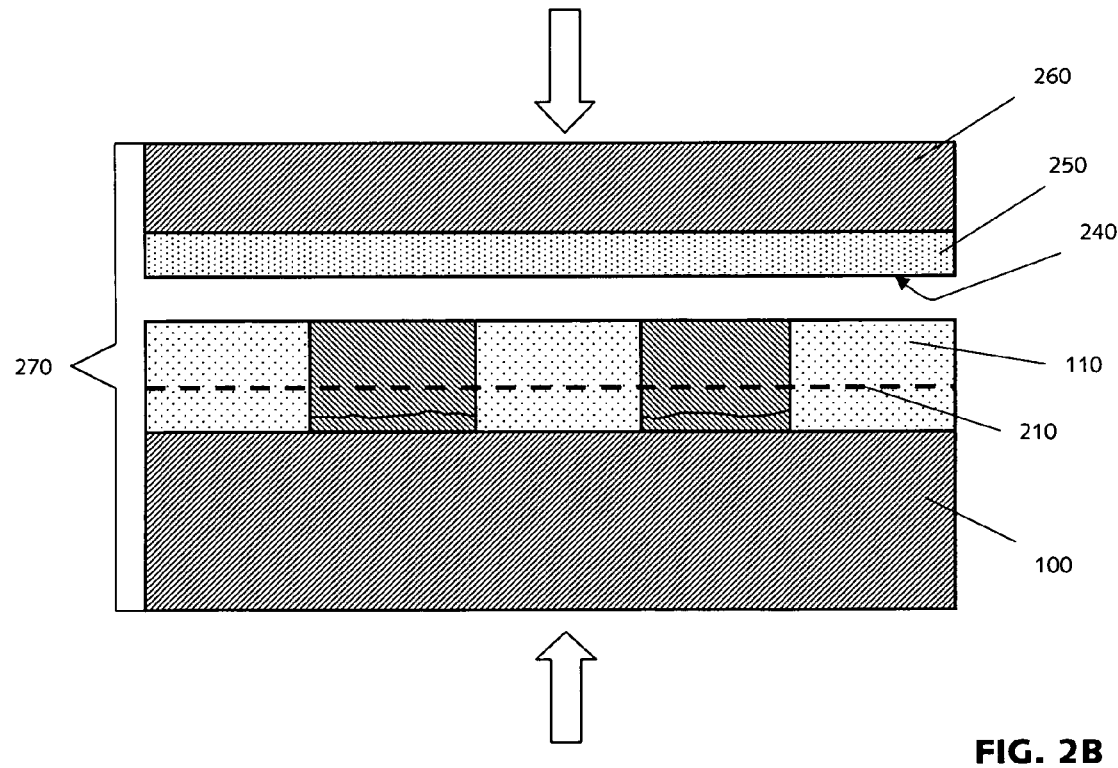

Referring to FIG. 2B, following ion implantation, top surfaces 160 and 170 of the active-area and the insulator regions are bonded to a surface 240 of an insulator layer 250 disposed over a semiconductor substrate 260 utilizing methods known in the art, e.g. as described in U.S. Pat. No. 6,602,613, incorporated herein by reference, thereby forming a structure 270. In one embodiment, to facilitate bonding, the surface 240 of the insulator layer and/or top surfaces 160, 170 is cleaned by a wet chemical cleaning process, e.g. by a hydrophilic surface preparation process. A suitable cleaning procedure for the prebonding surface preparation employs a modified megasonic RCA SC1 clean that includes application of a cleaning mixture including ammonium hydroxide, hydrogen peroxide, and water ($NH_4OH:H_2O_2:H_2O$) at a ratio of 1:4:20 at 60° C. for 10 minutes, followed by a deionized (DI) water rinse and spin dry. The wafer-bonding energy should be strong enough to sustain the subsequent layer transfer, as discussed below. In some embodiments, to increase the bond strength, top surfaces 160, 170 and/or the surface 240 of the insulator layer 250 are plasma-treated, either before, after, or instead of a wet clean. The plasma environment may include at least one of the following species: oxygen, ammonia, argon, nitrogen, diborane, and phosphine. After an appropriate cleaning step, top surfaces 160, 170 and the surface 240 are bonded together by bringing them in contact with each other at room temperature. The bond strength may be greater than 1000 mJ/m², achieved at a low temperature, such as, for example, less than 600° C. As skilled artisans will readily appreciate, bonding of top surfaces 160, 170 of the active-area and the insulator regions with the surface 240 of the insulator layer 250 generally requires that the root mean square surface roughness of these surfaces not exceed about 1 nm. Accordingly, in many embodiments, to improve bondability, the surfaces are planarized by CMP. In various embodiments, the insulator layer includes, or consists essentially of, silicon dioxide, aluminum oxide, silicon nitride, silicon carbide, or diamond, and may have a thickness of, e.g., 50-1000 nanometers (nm). The semiconductor substrate 260 may be, for example, a bulk silicon wafer, a bulk germanium wafer, a bulk III-V wafer such as gallium arsenide or indium phosphide, or a SOI substrate. In some embodiments, as mentioned above, semiconductor substrate 260 and insulator layer 250 may be replaced by another type of rigid platform, including but not limited to self-supporting substrates including or consisting essentially of glass, quartz, plastic, polymer, or any of the dielectrics discussed above in reference to insulator layer 250. The lattice mismatch between the active-area materials and the crystalline semiconductor material of substrate 260 may exceed approximately 4%. In a particular embodiment, the lattice mismatch between the active-area materials and the crystalline semiconductor material of substrate 260 exceeds approximately 8%.

In some embodiments, a top insulator layer (not shown) may be formed over the top surfaces 160, 170 of the active-area and insulator regions, resulting in insulator-on-insulator bonding. This top insulator layer may include, or consist essentially of, silicon dioxide, aluminum oxide, silicon nitride, silicon carbide, or diamond, and may have a thickness of, e.g., 50-1000 nm. In certain implementations of these embodiments, the top insulator layer is bonded directly to the substrate 260, without providing the insulator layer 250 therebetween.

Figure 2C:
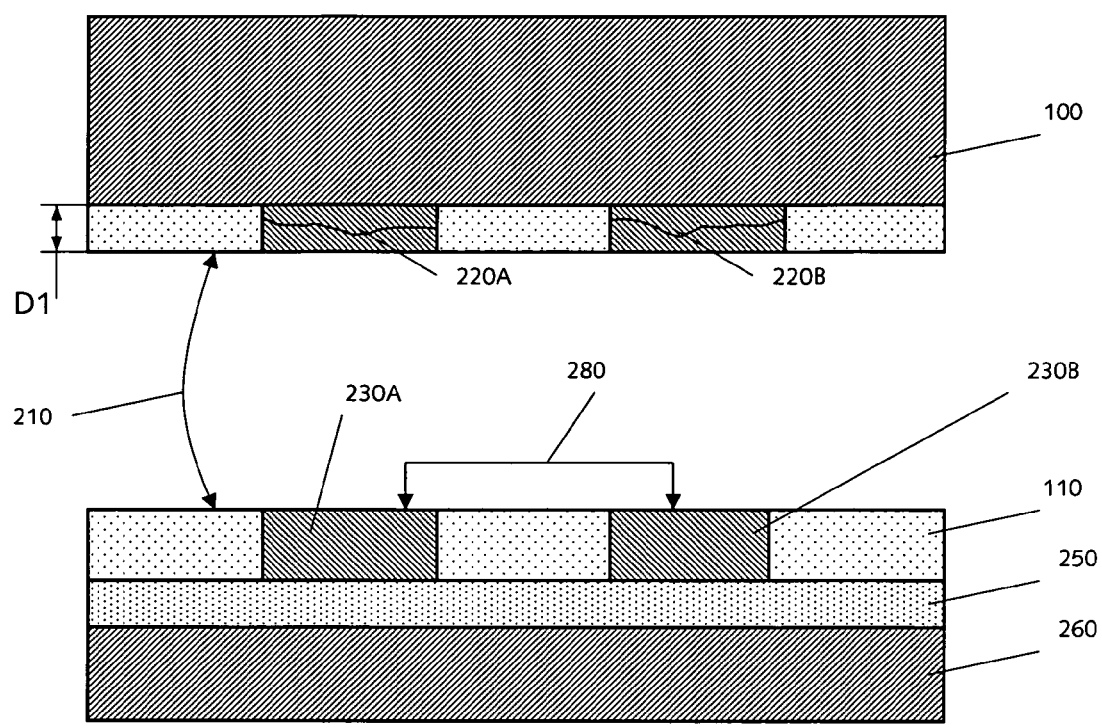
Figure 3A:
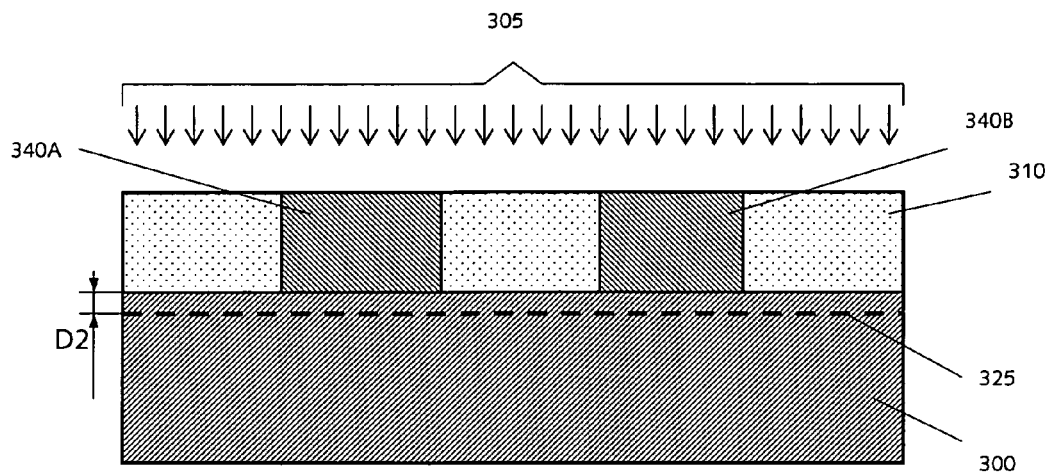
Figure 3B:
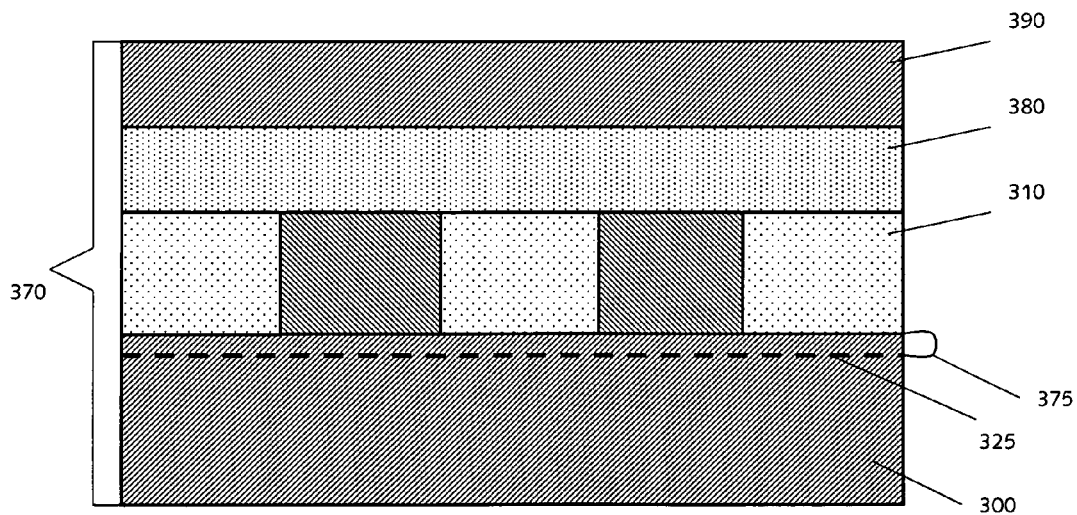
Figure 3C:
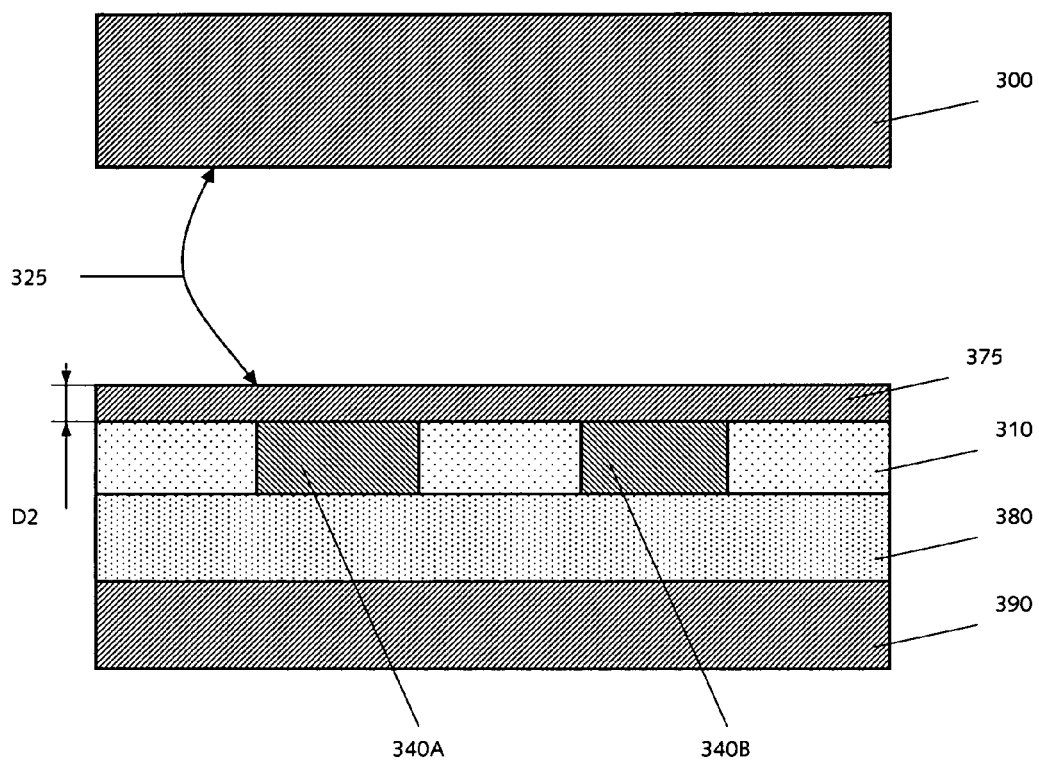
Figure 3D:
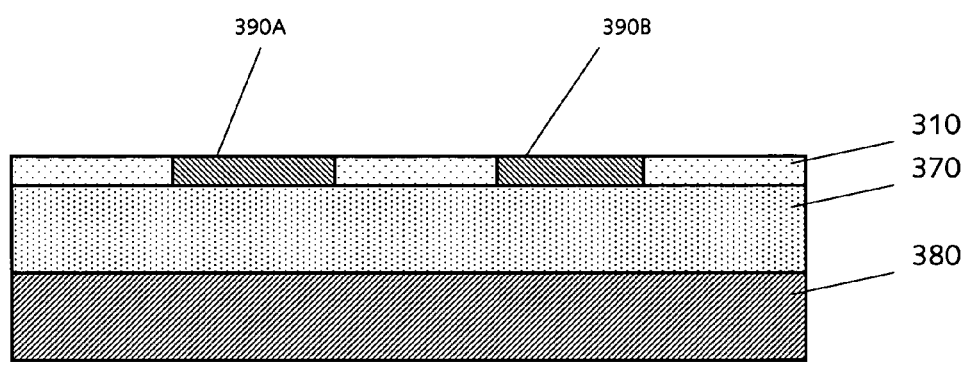

In various embodiments, the structure 270 is then subjected to thermal annealing at a temperature ranging from about 350° C. to 700° C. for a period of time from about five minutes to about four hours. Referring to FIG. 2C, the thermal annealing induces a split in the structure 270 along the cleave area 210, separating the substrate 100 with portions of the insulator layer 110, and the active-area regions 140A, 140B having thickness D1 thereon from the portions 230A, 230B of the active-area regions surrounded by the insulator regions and bonded to the insulator layer 250. In some embodiments, a mechanical force and/or a jet of gas or liquid may be applied to the structure 270 in addition to or instead of the thermal annealing to induce the split. Following the split, in many embodiments, exposed surfaces 280 of the active-area regions are planarized or smoothed, e.g. using CMP, to remove cleave-induced surface roughness and, if desired, reduce a thickness of the active-area regions to a desired value. In various embodiments, a root mean square surface roughness of the surface 280 does not exceed about 1 nm. Thus, alternative active-area regions 230A and 230B disposed over the common insulator are obtained.

As mentioned above, in various embodiments of the invention, the alternative active-area regions 230A and 230B are substantially exhausted of misfit and threading dislocations. Defect densities can be measured using a standard chromic acid-based Schimmel etch as outlined, for example, in Journal of the Electrochemical Society 126:479 (1979), and an optical microscope operated in differential interference contrast (Nomarski) mode. TDDs can be calculated by counting the number of etch pits per unit area located away from dislocation pile-ups, yielding units of inverse area (cm$^{-2}$). Dislocation pile-up densities can be calculated by measuring the total length of dislocation pile-ups per unit area, yielding units of inverse length (cm$^{-1}$). Defect densities may also preferably be confirmed by the use of a complementary characterization technique such as plan-view transmission electron microscopy. In various embodiments, a dislocation pile-up density in these active-area regions does not exceed about 20/cm, for example, is less than about 5/cm, preferably ranges from 0 to about 1/cm, and, more preferably, is less than about 0.01/cm. Also, TDD in these regions is less than about $10^5$ cm$^{-2}$, for example, less than about $10^3$ cm$^{-2}$, and, preferably, ranges between 0 and about $10^2$ cm$^{-2}$.

In some embodiments, the structure 270 is further annealed at a temperature ranging from 600-900° C., e.g., at a temperature greater than about 800° C., to strengthen the bond between the surfaces 160, 170 and the surface 240.

Referring now to FIGS. 3A-3D, in an alternative embodiment, co-planar active-area regions 340A and 340B and the regions of the insulator layer 310 surrounding the active-area regions are formed over the substrate 300 as described above in connection with FIGS. 1A-1C. Gaseous species 305, e.g. including, or consisting essentially of, ions of hydrogen, helium, argon, krypton, and/or neon, are introduced into the active-area and the insulator regions by, for example, ion implantation. In contrast with the embodiments described in connection with FIGS. 2A-2C, however, implantation of the gaseous species is controlled such that the species penetrate the substrate 300 through the active-area and the insulator regions, forming a narrow cleave area 325 at a predetermined distance D2 below the interface between the substrate and the active-area regions. The distance D2 may range, for example, from about 10 nm to about 1000 nm. As a result, the cleave area is disposed within a homogeneous zone of the crystalline material of the substrate 300. Following bonding and thermal annealing steps described above, the structure 370 is split along the cleave area 325, separating the substrate from a portion 375 thereof having the thickness D2 (and disposed over the active-area regions surrounded by the insulator regions) and bonded to an insulator layer 380, which itself, in turn, is disposed over a semiconductor substrate 390. As with the embodiments described above, the substrate 390 may be, for example, a bulk silicon wafer, a bulk germanium wafer, a bulk III-V wafer such as gallium arsenide or indium phosphide, or a SOI substrate. Then, the portion 375 of the substrate, as well as portions of the active-area and insulator regions disposed thereon, are removed by, for example, CMP to eliminate a highly-defective region proximate to the interface between the substrate and the active-area regions, as well as to obtain a desired thickness of the active-area regions. As a result, alternative active-area regions 330A and 330B disposed over the common insulator and substantially exhausted of misfit and threading dislocations are obtained. In many embodiments, a TDD of the alternative active-area regions is at least three (and, preferably, at least five) orders of magnitude lower than that present in the removed portion of the active-area material. In particular, in various embodiments, a dislocation pile-up density in these active-area regions does not exceed about 20/cm, for example, is less than about 1/cm, or, preferably, ranges from 0 to about 1/cm, and, more preferably, is less than about 0.01/cm. Also, TDD in these regions is less than about $10^5$ $cm^{-2}$, for example, less than about $10^3$ $cm^{-2}$, and, preferably, ranges from 0 to about $10^2$ $cm^{-2}$.

Figure 4A:
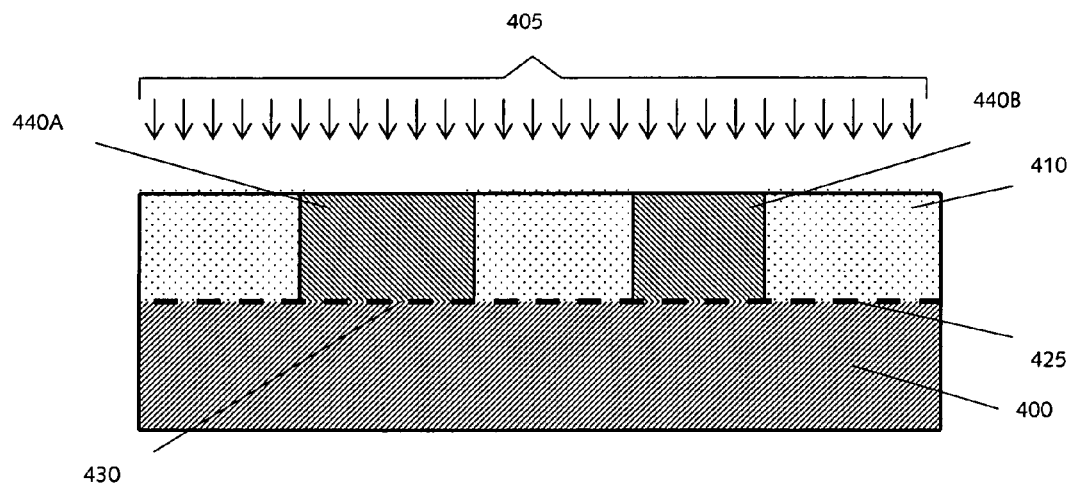
Figure 4B:
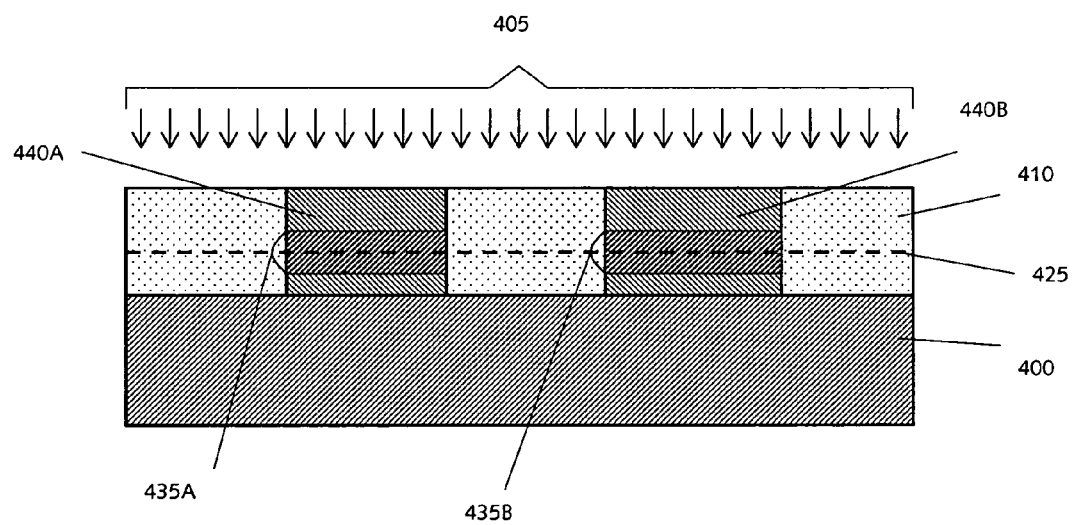

Referring to FIGS. 4A-4B, in other alternative embodiments, co-planar active-area regions 440A and 440B and the regions of the insulator layer 410 surrounding the active-area regions are formed over the substrate 400, as described above in connection with FIGS. 1A-1C. Gaseous species 405, e.g. including, or consisting essentially of, ions of hydrogen, helium, argon, krypton, and/or neon, are introduced into the active-area and the insulator regions by, for example, ion implantation. In contrast with the embodiments described in connection with FIGS. 2A-2C, however, in one embodiment, implantation of the gaseous species is controlled such that the species penetrate through the active-area and the insulator regions to an interface 430 between the substrate and the active-area regions, forming a narrow cleave area 425 that substantially coincides with the interface, as shown in FIG. 4A. Following bonding and thermal annealing steps described above, the resulting structure is split along the cleave area, separating the substrate from the active-area regions surrounded by the insulator regions and bonded to an insulator layer, which itself, in turn, is disposed over a semiconductor substrate. In one embodiment, in order to promote formation of the narrow cleave area 425 substantially coincident with the interface 430, a mild thermal anneal is performed after implantation of gaseous species 405. This anneal promotes diffusion of gaseous species 405 to interface 430 and any crystalline defects that may be present there. The anneal may be performed at, for example, 100-300° C. for a period of 1-30 minutes.

Referring now to FIG. 4B, in another embodiment, strained layers 435A and 435B are formed within the active-area regions during epitaxial deposition. For example, a layer of a semiconductor material that is lattice-mismatched to the active-area material can be selectively deposited over a portion of the active-area material to a thickness below the critical thickness of such lattice-mismatched material, and then the rest of the active-area material is deposited over the lattice-mismatched material. Preferably, the strained layer is tensilely, rather than compressively, strained to better accommodate implanted ions within its crystalline lattice. Implantation of the gaseous species is controlled such that the species penetrate through the active-area and the insulator regions to the strained layers, forming a narrow cleave area 425 that substantially coincides with the strained layers in the active-area regions. Following bonding and thermal annealing steps described above, the resulting structure is split along the cleave area, separating the substrate from a portion thereof disposed over the active-area regions surrounded by the insulator regions and bonded to an insulator layer, which itself, in turn, is disposed over a semiconductor substrate.

Following the split, exposed surfaces of the active-area regions can be planarized or smoothed, e.g. using CMP, to remove cleave-induced surface roughness and, if desired, reduce a thickness of the active-area regions to a desired value. As a result, alternative active-area regions disposed over the insulator and substantially exhausted of misfit and threading dislocations are obtained. Notably, in these embodiments, employing the interface area between the substrate and the active-area regions or the deliberately-introduced strained layer as a target height for the cleave area improves control over penetration of the implanted ions and associated thickness of the active-area regions. Also, because of the high concentration of dislocation defects in the interface area and the strained layer, a lesser concentration of implanted ions and/or a more efficient (e.g., lower) thermal budget is needed to effect cleave-induced split within the bonded structure. In addition, any portion of strained layers 435A, 435B remaining after splitting and planarization may be used in subsequently formed devices, as, for example, transistor channel regions with enhanced mobility.

Figure 5A:
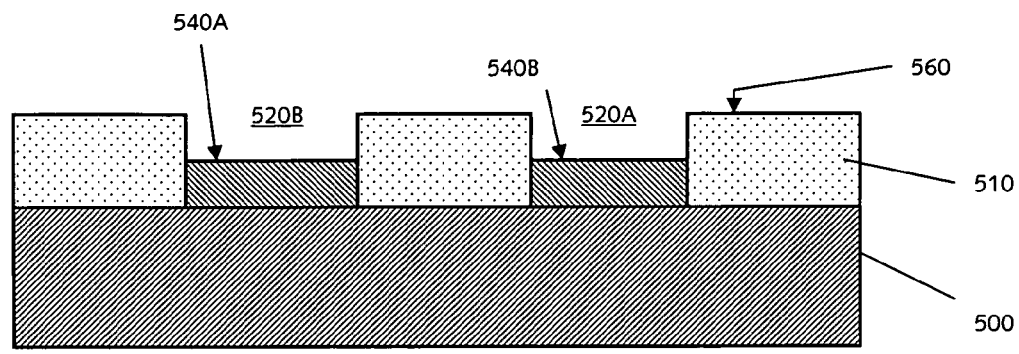
Figure 5B:
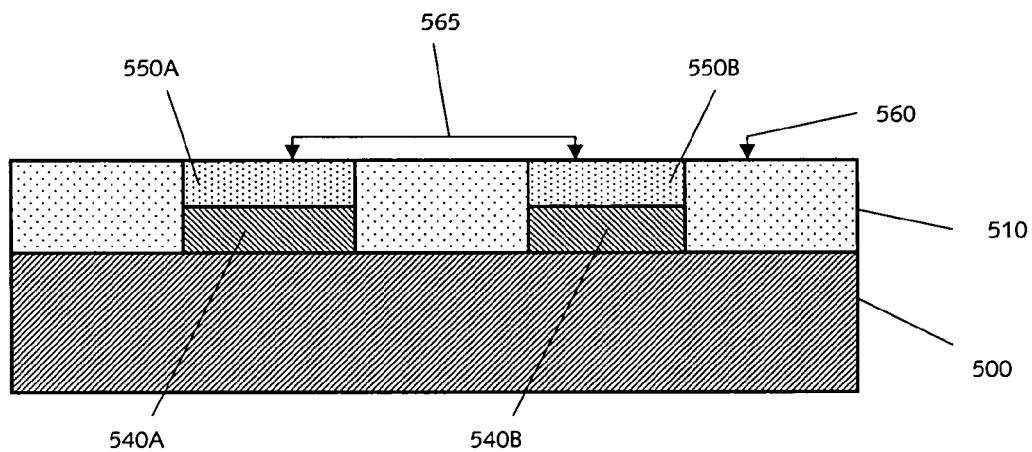
Figure 5C:
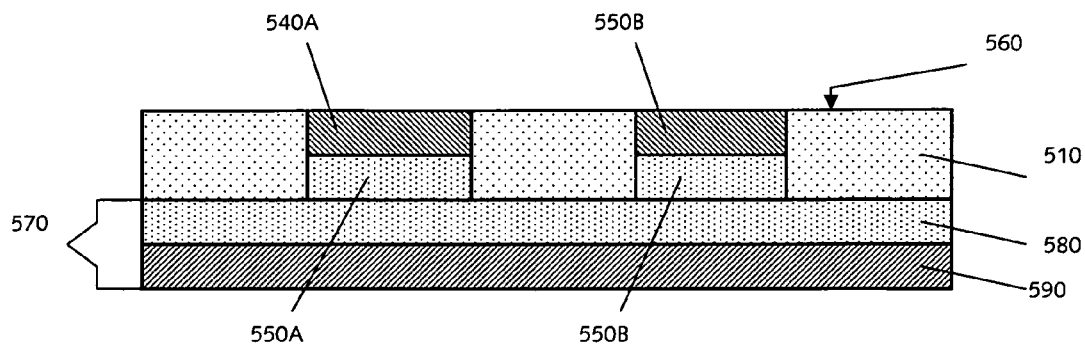

Referring to FIGS. 5A-5C, in certain implementations of the embodiments described above with reference to FIGS. 1B-1C, the epitaxially deposited active area material(s) only partially fill openings 520A and 520B defined in an insulator layer 510 and extending to the substrate 500. Thus, top surfaces of active-area regions 540A and 540B do not reach to the top surface 560 of the insulator layer. The remaining space in the openings can be left empty, or, as shown in FIG. 5B, filled with a dielectric material forming buffer regions 550A and 550B over the active-area regions. The dielectric material may be deposited over the entire surface of active-area regions 540A, 540B and top surface 560 of the insulator layer. The structure may then be planarized such that any dielectric material formed over top surface 560 of the insulator layer is removed, and the dielectric material remains only over active-area regions 540A, 540B. Should any dielectric material remain over top surface 560 of the insulator layer, it will at least be co-planar with a top surface of buffer regions 550A, 550B. The dielectric material may include, or consist essentially of, silicon dioxide, aluminum oxide, silicon nitride, and/or silicon carbide, and can be the same material used for the insulator layer 510, or a different material. In some embodiments, the dielectric material is a low-K dielectric with a lower dielectric constant than that of silicon dioxide; such materials are particularly suitable for subsequent manufacturing of FDSOI devices. The dielectric material can be deposited, such as by CVD or ALD, or spun on from a solution. Suitable thicknesses for the dielectric material range from 10 to 200 nm. Examples of suitable low-K dielectrics include silsequioxane-based polycyclic oligomers or polymers such as hydroxyl silsequioxane (HSQ) or methyl silsequioxane (MSQ); Black Diamond, available from Applied Materials, Inc. of Santa Clara, Calif.; CORAL, available from Novellus Systems Inc. of San Jose, Calif.; other organosilicate glasses or carbon doped oxides (SiCOH); SiLK, available from Dow Chemical Co. of Midland, Mich.; benzocyclobutene (BCB); porous silica; polymer foams; and GX-3, HOSP, and NANOGLASS, available from Honeywell International Inc. of Sunnyvale, Calif.

Still referring to FIG. 5B, following deposition of the dielectric material in the openings 520A and 520B, top surface 565 of the dielectric buffer regions is optionally planarized for improved bondability. Then, with reference to FIG. 5C, the steps of forming a cleave area by ion implantation, bonding, and annealing with optional post-annealing planarization of the active-area regions are performed in a manner similar to that described above in connection with FIGS. 2A-2C, 3A-3D, and 4A-4B, forming the active-area regions of desired thickness disposed over the dielectric regions 550. The dielectric buffer regions are bonded to a handle wafer 570, including a semiconductor substrate 590 having an optional insulating layer 580 thereover. Thus, in the implementations described with reference to FIGS. 5A-5C, a final thickness of the active-area regions is established prior to the bonding steps. Also, in some versions, having dielectric buffer regions of the active-area regions generally facilitates bondability to the insulator layer 590.

Figure 6A:
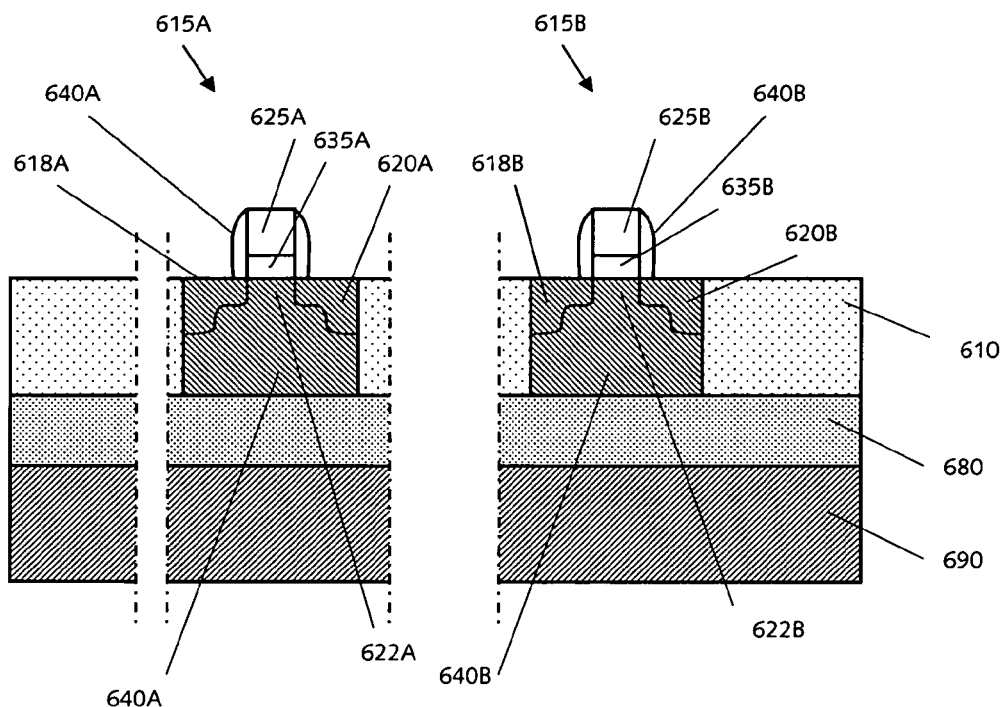
FIG. 6A-6B depict schematic cross-sectional side views of electronic devices fabricated over the semiconductor structures formed as illustrated in the preceding figures.

In many applications, various electronic devices can be formed in the on-insulator portions of the active-area regions. Referring to FIG. 6A, in some embodiments, active area regions 640A, 640B are formed over a common insulator layer 680 disposed over a semiconductor wafer 690, as described above in connection with FIGS. 2A-2C, 3A-3C, or 4A-4B. Then, an n-MOS transistor 615A and a p-MOS transistor 615B are formed, having source regions 618A, 618B, drain regions 620A, 620B, and channel regions 622A, 622B disposed in the active-area material(s). The insulator regions 610 function as isolation regions, e.g., shallow trench isolation regions, for transistor 615A, 615B.

Figure 6B:
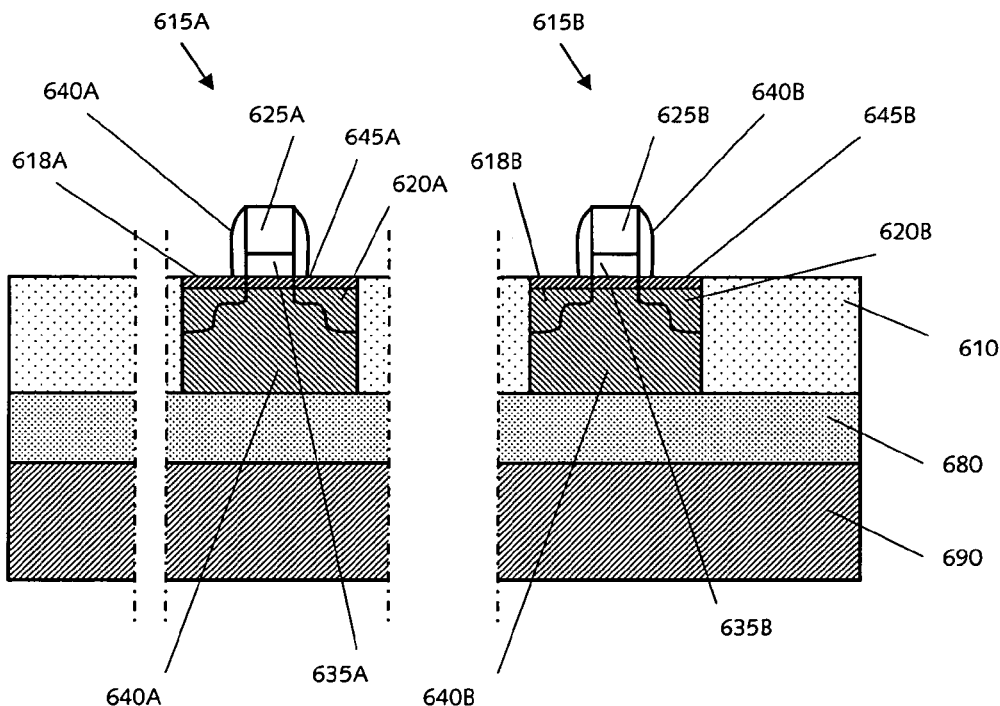

Additional semiconductor layers may be formed above the active areas on the insulator. For example, referring to FIG. 6B, in some embodiments, thin strained semiconductor layers 645A, 645B are formed atop the active areas and can be subsequently used as channels for transistors. In one embodiment, the layers 645A, 645B are tensilely strained and formed of silicon. In this embodiment, these layers may be formed in a dedicated chamber of a deposition tool that is not exposed to the source gases for the epitaxial growth of the active-area material, thereby avoiding cross-contamination and improving the quality of the interface between the strained layers and the active-area regions. Furthermore, strained layers 645A, 645B may be formed from one or more isotopically pure precursors. Isotopically pure materials have better thermal conductivity than conventional materials consisting of mixtures of different isotopes. Higher thermal conductivity may help dissipate heat from devices subsequently formed on these strained layers, thereby maintaining the enhanced carrier mobilities these layers provide. In other embodiments, the strained layers may be formed of SiGe, or at least one group II, group III, group V, and/or group VI element. In various embodiments, the strained layers have a thickness of, for example, 50-500 Å, preferably below 300 Å.

Further processing steps may include the formation of gate dielectric layers 635A, 635B, the deposition of gate electrode materials 625A, 625B, and the definition of gates by, e.g., dry etching, such that spacers 642A, 642B are formed adjacent to the gate dielectric and gate electrode layers. The source and drain regions may be defined by an ion implantation step. Interlayer dielectrics may be formed over gate, source, and drain, and contact holes may be defined. Metal layers may be deposited in the contact holes and over the structure. In some embodiments, the interlayer dielectrics, for example, including or consisting essentially of, silicon nitride, are used to induce strain on at least one of channel regions 622A, 622B.

Suitable methods for fabrication of CMOS devices, e.g. those having different n- and p-active areas, are described in co-pending provisional application Ser. No. 60/702,363, incorporated herein by reference. The resulting transistors may be, for example, a field-effect transistor (FET), such as a complementary metal-oxide-semiconductor FET (CMOS-FET) or a metal-semiconductor FET (MESFET). In an alternative embodiment, the device is a non-FET device such as a diode. The diode device could be a light detecting device (photodiode), or a light emitting device (either a light-emitting diode, or a laser diode). In an alternative application, the device is a bipolar junction transistor.

Other embodiments incorporating the concepts disclosed herein may be used without departing from the spirit of the essential characteristics of the invention or the scope thereof. The foregoing embodiments are therefore to be considered in all respects as only illustrative rather than restrictive of the invention described herein. Therefore, it is intended that the scope of the invention be only limited by the following claims.

The invention claimed is:

1. A semiconductor device structure comprising:
 a substrate comprising a base insulator layer disposed over a base semiconductor layer comprising a first crystalline semiconductor material;
 a patterned insulator layer disposed over the substrate, the patterned insulator layer defining a first opening and a second opening exposing portions of the base insulator layer;
 a first active-area region formed in the first opening, the first active-area region comprising a first active-area material having a threading dislocation density less than approximately $10^5$ cm$^{-2}$ and disposed over and in contact with the base insulator layer;
 a second active-area region formed in the second opening, the second active-area region comprising a second active-area material having a threading dislocation density less than approximately $10^5$ cm$^{-2}$ and disposed over and in contact with the base insulator layer;
 a p-type metal-oxide-semiconductor (PMOS) transistor disposed over and including at least a portion of the first active-area region, the PMOS transistor including:
  a first gate dielectric region disposed over the first active-area region,
  a first gate disposed over the first gate dielectric region, the first gate comprising a first conducting layer,
  a first source and a first drain regions formed in the first active-area region proximate the first gate dielectric region, the first source and first drain region including p-type dopants; and
 an n-type metal-oxide-semiconductor (NMOS) transistor disposed over and including at least a portion of the second active-area region, the NMOS transistor including:
  a second gate dielectric region disposed over the second active-area region,
  a second gate disposed over the second gate dielectric region, the second gate comprising a second conducting layer, a second source and a second drain regions formed in the second active-area region proximate the second gate dielectric region, the second source and second drain including n-type dopants, wherein both the first active-area material and the second active-area material are different from the first crystalline semiconductor material, and the first active-area material is different from the second active-area material.

2. The structure of claim 1 further comprising a strained semiconductor layer disposed over at least one of the first active-area material or the second active-area material.

3. The structure of claim 1 wherein the first active area-material and the second active-area material are substantially free of misfit dislocations.

4. The structure of claim 1 wherein the first active-area material and the second active-area material are substantially free of threading dislocations.

5. The structure of claim 1 wherein the first active-area material is substantially relaxed to its equilibrium lattice constant and the second active-area material is substantially relaxed to its equilibrium lattice constant.

6. The structure of claim 1 wherein the first crystalline semiconductor material comprises silicon, the first active-area material comprises germanium, and the second active-area material comprises a III-V compound.

7. The structure of claim 6 wherein the first crystalline semiconductor material consists essentially of silicon, the first active-area material consists essentially of germanium, and the second active-area material consists essentially of the III-V compound.

8. The structure of claim 1 wherein, during operation, an off-state current of the PMOS transistor and an off-state current of the NMOS transistor are both less than about $10^{-8}$ A/μm.

9. The structure of claim 1 wherein a lattice mismatch between the first active-area material and the first crystalline semiconductor material and a lattice mismatch between the second active-area material and the first crystalline semiconductor material both exceed approximately 4%.

10. The structure of claim 9 wherein the lattice mismatch between the first active-area material and the first crystalline semiconductor material and the lattice mismatch between the second active-area material and the first crystalline semiconductor material both exceed approximately 8%.

11. The structure of claim 1 further comprising a strained semiconductor layer disposed between the first active-area material and the first gate dielectric region.

12. The structure of claim 1 further comprising a strained semiconductor layer disposed between the second active-area material and the second gate dielectric region.

13. The structure of claim 1 wherein a dislocation pile-up density of the first active-area material and a dislocation pile-up density of the second active-area material are both less than about 1/cm.

14. The structure of claim 1 wherein the base insulator layer consists essentially of at least one of silicon dioxide or silicon nitride.

15. A semiconductor structure comprising:
a substrate comprising a base insulator layer disposed over a base semiconductor layer comprising a first crystalline semiconductor material;
a patterned insulator layer disposed over and in direct contact with the base insulator layer, the patterned insulator layer defining a first opening and a second opening;
a first active-area region formed in the first opening and in contact with the substrate, the first active-area region comprising a first active-area material having a threading dislocation density less than approximately $10^5$ cm$^{-2}$; and
a second active-area region formed in the second opening and in contact with the substrate, the second active-area region comprising a second active-area material having a threading dislocation density less than approximately $10^5$ cm$^{-2}$, wherein the first active-area material is different from the second active-area material, the first active-area material is disposed over and in contact with the base insulator layer, and the second active-area material is disposed over and in contact with the base insulator layer, the first crystalline semiconductor material comprises silicon, the first active-area material comprises germanium, and the second active-area material comprises a III-V compound.

16. The semiconductor structure of claim 15 further comprising:
a p-type metal-oxide-semiconductor transistor disposed over and including at least a portion of the first active-area region; and
an n-type metal-oxide-semiconductor transistor disposed over and including at least a portion of the second active-area region.

17. The structure of claim 16 wherein, during operation, an off-state current of the p-type metal-oxide-semiconductor transistor and an off-state current of the n-type metal-oxide-semiconductor transistor are both less than about $10^{-8}$ A/μm.

18. The structure of claim 15 wherein the first active area-material and the second active-area material are substantially free of misfit dislocations.

19. The structure of claim 15 wherein the first active-area material and the second active-area material are substantially free of threading dislocations.

20. The structure of claim 15 wherein the first active-area material is substantially relaxed to its equilibrium lattice constant and the second active-area material is substantially relaxed to its equilibrium lattice constant.

21. The structure of claim 15 wherein the first crystalline semiconductor material consists essentially of silicon, the first active-area material consists essentially of germanium, and the second active-area material consists essentially of the III-V compound.

22. The structure of claim 15 wherein a dislocation pile-up density of the first active-area material and a dislocation pile-up density of the second active-area material are both less than about 1/cm.

23. The structure of claim 15 wherein the base insulator layer consists essentially of at least one of silicon dioxide or silicon nitride.

24. The structure of claim 15, further comprising a strained semiconductor layer disposed over the first active-area material.

25. The structure of claim 24 further comprising a second strained semiconductor layer disposed over the second active-area material.

26. The structure of claim 15 further comprising a strained semiconductor layer disposed over the second active-area material.

27. A semiconductor structure comprising:
a substrate comprising a base insulator layer disposed over a base semiconductor layer comprising a first crystalline semiconductor material;
a patterned insulator layer disposed over and in direct contact with the base insulator layer, the patterned insulator layer defining a first opening and a second opening;

a first active-area region formed in the first opening and in contact with the substrate, the first active-area region comprising a first active-area material having a threading dislocation density less than approximately $10^5$ cm$^{-2}$;

a second active-area region formed in the second opening and in contact with the substrate, the second active-area region comprising a second active-area material having a threading dislocation density less than approximately $10^5$ cm$^{-2}$; and a strained semiconductor layer disposed over the first active-area material, wherein the first active-area material is different from the second active-area material, the first active-area material is disposed over and in contact with the base insulator layer, and the second active-area material is disposed over and in contact with the base insulator layer.

28. The semiconductor structure of claim 27 wherein both the first active-area material and the second active-area material are different from the first crystalline semiconductor material.

29. The structure of claim 27 wherein a lattice mismatch between the first active-area material and the first crystalline semiconductor material and a lattice mismatch between the second active-area material and the first crystalline semiconductor material both exceed approximately 4%.

30. The structure of claim 29 wherein the lattice mismatch between the first active-area material and the first crystalline semiconductor material and the lattice mismatch between the second active-area material and the first crystalline semiconductor material both exceed approximately 8%.

31. The structure of claim 27 further comprising a second strained semiconductor layer disposed over the second active-area material.

32. The structure of claim 27 further comprising:
a p-type metal-oxide-semiconductor transistor disposed over and including at least a portion of the first active-area region; and
an n-type metal-oxide-semiconductor transistor disposed over and including at least a portion of the second active-area region.

33. The structure of claim 32 wherein, during operation, an off-state current of the p-type metal-oxide-semiconductor transistor and an off-state current of the n-type metal-oxide-semiconductor transistor are both less than about $10^{-8}$ A/μm.

34. The structure of claim 32 wherein the first active area-material and the second active-area material are substantially free of misfit dislocations.

35. The structure of claim 32 wherein the first active-area material and the second active-area material are substantially free of threading dislocations.

36. The structure of claim 32 wherein the first active-area material is substantially relaxed to its equilibrium lattice constant and the second active-area material is substantially relaxed to its equilibrium lattice constant.

37. The structure of claim 32 wherein a dislocation pile-up density of the first active-area material and a dislocation pile-up density of the second active-area material are both less than about 1/cm.

38. The structure of claim 32 wherein the base insulator layer consists essentially of at least one of silicon dioxide or silicon nitride.

39. A semiconductor structure comprising;
a substrate comprising a base insulator layer disposed over a base semiconductor layer comprising a first crystalline semiconductor material;
a patterned insulator layer disposed over and in direct contact with the base insulator layer, the patterned insulator layer defining a first opening and a second opening;
a first active-area region formed in the first opening and in contact with the substrate, the first active-area region comprising a first active-area material having a threading dislocation density less than approximately $10^5$ cm$^{-2}$;
a second active-area region formed in the second opening and in contact with the substrate, the second active-area region comprising a second active-area material having a threading dislocation density less than approximately $10^5$ cm$^{-2}$; and
a strained semiconductor layer disposed over the second active-area material,
wherein the first active-area material is different from the second active-area material, the first active-area material is disposed over and in contact with the base insulator layer, and the second active-area material is disposed over and in contact with the base insulator layer.

40. The structure of claim 39 further comprising:
a p-type metal-oxide-semiconductor transistor disposed over and including at least a portion of the first active-area region; and
an n-type metal-oxide-semiconductor transistor disposed over and including at least a portion of the second active-area region.

41. The structure of claim 40 wherein, during operation, an off-state current of the p-type metal-oxide-semiconductor transistor and an off-state current of the n-type metal-oxide-semiconductor transistor are both less than about $10^{-8}$ A/μm.

* * * * *